(12) United States Patent
Arai et al.

(10) Patent No.: US 7,295,411 B2
(45) Date of Patent: Nov. 13, 2007

(54) SEMICONDUCTOR INTEGRATED CIRCUIT DEVICE

(75) Inventors: Katsuya Arai, Kyoto (JP); Toshihiro Kogami, Kyoto (JP); Hiroaki Yabu, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 469 days.

(21) Appl. No.: 10/913,356

(22) Filed: Aug. 9, 2004

(65) Prior Publication Data

US 2005/0040466 A1    Feb. 24, 2005

(30) Foreign Application Priority Data

Aug. 19, 2003    (JP)    ............... 2003-295245

(51) Int. Cl.
*H02H 9/00* (2006.01)
(52) U.S. Cl. ....................................... 361/56
(58) Field of Classification Search ................... 361/56
See application file for complete search history.

(56) References Cited

U.S. PATENT DOCUMENTS

| | | | |
|---|---|---|---|
| 5,528,188 A * | 6/1996 | Au et al. | ..................... 327/310 |
| 5,559,659 A * | 9/1996 | Strauss | ........................ 361/56 |
| 5,744,842 A | 4/1998 | Ker | |
| 6,157,530 A * | 12/2000 | Pequignot et al. | .......... 361/111 |
| 6,262,873 B1 * | 7/2001 | Pequignot et al. | .......... 361/111 |
| 6,369,994 B1 * | 4/2002 | Voldman | ..................... 361/56 |
| 6,965,503 B2 * | 11/2005 | Connor et al. | ................ 361/56 |
| 2002/0066929 A1 * | 6/2002 | Voldman | ..................... 257/355 |

FOREIGN PATENT DOCUMENTS

| | | |
|---|---|---|
| JP | 7-22617 | 1/1995 |
| JP | 2001-308200 A | 11/2001 |
| JP | 2003-124328 A | 4/2003 |

* cited by examiner

*Primary Examiner*—Ronald W. Leja
(74) *Attorney, Agent, or Firm*—McDermott Will & Emery LLP

(57) ABSTRACT

An inventive semiconductor integrated circuit device includes: an external connection terminal; an electrostatic discharge protection circuit; an output circuit; an output prebuffer circuit; an input prebuffer circuit; an internal circuit; an inter-power supply electrostatic discharge protection circuit; and a substrate potential control circuit. The substrate potential control circuit includes a capacitor and a resistor. The inter-power supply electrostatic discharge protection circuit includes an NMIS transistor. When a positive surge is applied to the external connection terminal, the substrate potential of the NMIS transistor is also increased. Thus, the NMIS transistor is turned ON, and the positive electrical charge supplied to the external connection terminal is discharged toward a ground line.

21 Claims, 14 Drawing Sheets

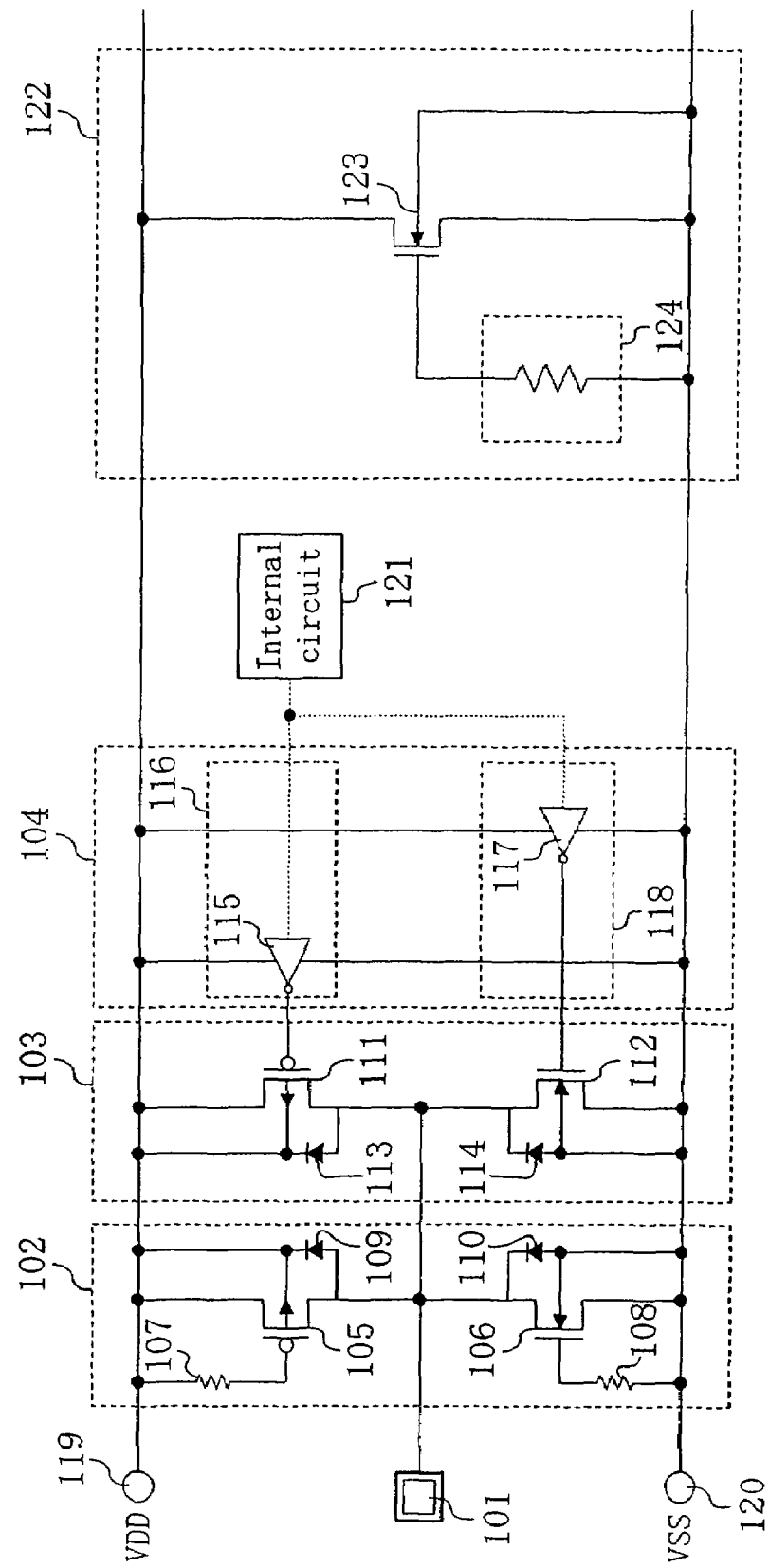
FIG. 13 – PRIOR ART

SEMICONDUCTOR INTEGRATED CIRCUIT DEVICE

CROSS-REFERENCE TO RELATED APPLICATION

This application claims priority under 35 U.S.C. §119(a) on Japanese Patent Application No. 2003-295245 filed on Aug. 19, 2003, the entire contents of which are hereby incorporated by reference.

BACKGROUND OF THE INVENTION

The present invention relates to a semiconductor integrated circuit device including an electrostatic discharge (ESD) protection circuit, and more particularly relates to a semiconductor integrated circuit device including an ESD protection circuit having an improved capability for protecting an input circuit, an output circuit, an input/output circuit and an internal circuit from ESD.

In recent years, in the processing of semiconductor integrated circuit devices, the level of integration has been increased in accordance with technical advances in miniaturization and achievement of higher density. Accordingly, semiconductor integrated circuit devices are vulnerable to damage caused by electrostatic discharge (hereinafter, called "surge"). For example, a surge penetrated from an external connection terminal might destroy an element such as an input circuit, an output circuit, an input/output circuit or an internal circuit, thus increasing the possibility of reduction in performance of the element. Therefore, if a semiconductor integrated circuit device is provided with an external connection terminal, the device often includes a protection circuit for protecting an input circuit, an output circuit, an input/output circuit or an internal circuit from a surge. Such a protection circuit is herein called an "electrostatic discharge protection circuit".

FIG. 13 is an electric circuit diagram illustrating the configuration of an output circuit of a known semiconductor integrated circuit device including an electrostatic discharge protection circuit, and the periphery of the output circuit. As shown in FIG. 13, the known semiconductor integrated circuit device includes: an external connection terminal 101; an electrostatic discharge protection circuit 102; an output circuit 103; an output prebuffer circuit 104; an internal circuit 121; and an inter-power supply electrostatic discharge protection circuit 122. Herein, the "inter-power supply electrostatic discharge protection circuit" refers to the electrostatic discharge protection circuit located between a line through which a power supply voltage VDD is supplied and another line through a ground voltage VSS is supplied. The electrostatic discharge protection circuit 102 and the inter-power supply electrostatic discharge protection circuit 122 are provided so as to protect the output circuit 103 from a surge penetrated from the external connection terminal 101.

The electrostatic discharge protection circuit 102 is provided between the external connection terminal 101 and the output circuit 103, and includes a PMIS transistor 105, an NMIS transistor 106, a resistor 107 and a resistor 108. As used herein, "PMIS transistor" refers to a p-channel MIS transistor, and "NMIS transistor" refers to an n-channel MIS transistor. The PMIS transistor 105 includes: a source connected to a power supply line 119 through which the power supply voltage VDD is supplied; a gate connected to the power supply line 119 with the resistor 107 interposed therebetween; a drain connected to the external connection terminal 101; and a substrate region (n-well) connected to the power supply line 119. On the other hand, the NMIS transistor 106 includes: a source connected to a ground line 120; a gate connected to the ground line 120 with the resistor 108 interposed therebetween; a drain connected to the external connection terminal 101; and a substrate region (p-well) connected to the ground line 120.

The output circuit 103 is provided between the electrostatic discharge protection circuit 102 and the output prebuffer circuit 104, and includes a PMIS transistor 111 and an NMIS transistor 112. The PMIS transistor 111 includes: a source connected to the power supply line 119; a gate connected to an output terminal of a first prebuffer 115 of the output prebuffer circuit 104; a drain connected to the external connection terminal 101; and a substrate region (n-well) connected to the power supply line 119. On the other hand, the NMIS transistor 112 includes: a source connected to the ground line 120; a gate connected to an output terminal of a second prebuffer 117 of the output prebuffer circuit 104; a drain connected to the external connection terminal 101; and a substrate region (p-well) connected to the ground line 120.

The output prebuffer circuit 104 amplifies an output signal from the internal circuit 121, and is provided between the internal circuit 121 and the output circuit 103. The output prebuffer circuit 104 includes: a first prebuffer circuit 116 provided at its last stage with the first prebuffer 115; and a second prebuffer circuit 118 provided at its last stage with a second prebuffer 117. The first prebuffer 115 is provided with: a terminal which is connected to the power supply line 119 and through which a power supply voltage is supplied; a ground terminal connected to the ground line 120; an output terminal connected to the gate of the PMIS transistor 111 of the output circuit 103; and an input terminal connected to the internal circuit 121. On the other hand, the second prebuffer 117 is provided with: a terminal which is connected to the power supply line 119 and through which a power supply voltage is supplied; a ground terminal connected to the ground line 120; an output terminal connected to the gate of the NMIS transistor 112 of the output circuit 103; and an input terminal connected to the internal circuit 121. It should be noted that the first and second prebuffer circuits 116 and 118 are each provided with prebuffers whose number is determined in accordance with the degree of amplification of an output signal from the internal circuit 121. Output signals whose levels are the same or opposite to each other are sent from the output terminal of the first prebuffer 115 at the last stage of the first prebuffer circuit 116 and that of the second prebuffer 117 at the last stage of the second prebuffer circuit 118.

The inter-power supply electrostatic discharge protection circuit 122 is provided between the power supply line 119 and the ground line 120, and includes an NMIS transistor 123. The NMIS transistor 123 includes: a source connected to the ground line 120 for grounding; a gate connected to the ground line 120 with a resistor 124 interposed therebetween; a drain connected to the power supply line 119; and a substrate region (p-well) connected to the ground line 120.

In the known semiconductor integrated circuit device implemented as described above, a surge applied between the power supply line 119 and the external connection terminal 101 is absorbed due to the breakdown of the PMIS transistor 105, while a surge applied between the ground line 120 and the external connection terminal 101 is absorbed due to the breakdown of the NMIS transistor 106. Thus, the output circuit 103 is protected from a surge penetrated from outside through the external connection terminal 101.

Semiconductor integrated circuit devices must ensure, for users, resistance to destruction caused by surge, and thus need to meet ESD test standards. Recently, as the ESD test standards, human body model (HBM) test standards, typified by MIL standards, have been used as global standards, and therefore, semiconductor integrated circuit devices are required to meet such standards.

FIGS. 14A and 14B are a circuit diagram illustrating an evaluation circuit for carrying out an ESD test according to HBM test standards, and a graph showing an HBM discharge waveform obtained in carrying out the test according to the MIL test standards, respectively.

As shown in FIG. 14A, the evaluation circuit includes two sub-circuits provided in parallel with respect to a charge and discharge capacitor 151 having a capacitance C of 100 pF (one of the two sub-circuits is shown in the left hand part of FIG. 14A, while the other sub-circuit is shown in the right-hand part of FIG. 14A). The sub-circuit shown in the left-hand part of FIG. 14A is provided with a voltage-variable charge power supply 150, while the sub-circuit shown in the right-hand part of FIG. 14A is provided with a discharge resistor 153 having a resistance R of 1.5 kΩ. The evaluation circuit further includes a selector switch 152 connected to one electrode of the charge and discharge capacitor 151. Via the selector switch 152, a high-voltage section of the charge power supply 150 and the discharge resistor 153 are alternately connected to said one electrode of the charge and discharge capacitor 151. The other electrode of the charge and discharge capacitor 151 is connected to a low-voltage section of the charge power supply 150 in the sub-circuit shown in the left-hand part of FIG. 14A, and is connected to the discharge resistor 153 in the sub-circuit shown in the right-hand part of FIG. 14A. In the sub-circuit shown in the right-hand part of FIG. 14A, a device to be tested 154 is interposed between the other electrode of the charge and discharge capacitor 151 and the discharge resistor 153 and an ESD test is carried out on the device to be tested 154.

In carrying out an ESD test using this evaluation circuit, first, said one electrode of the charge and discharge capacitor 151 is connected to the charge power supply 150 via the selector switch 152. Thus, the sub-circuit shown in the left-hand part of FIG. 14A becomes a closed circuit, and the charge power supply 150 allows electrical charges to be accumulated in the charge and discharge capacitor 151. The charging voltage at this time is 4000 V, for example. Thereafter, said one electrode of the charge and discharge capacitor 151 is connected to the discharge resistor 153 via the selector switch 152. Thus, the sub-circuit shown in the right-hand part of FIG. 14A becomes a closed circuit, and the electrical charges accumulated in the charge and discharge capacitor 151 are applied to the semiconductor integrated circuit device, i.e., the device to be tested 154, through the discharge resistor 153.

In this case, the test is carried out in accordance with the waveform as shown in FIG. 14B. In FIG. 14B, the abscissa axis represents a period of time during which stress is applied, the ordinate axis represents surge current (A), Tr represents rise time (ns), and Td represents damping time (ns).

In the known semiconductor integrated circuit device shown in FIG. 13, during a normal operation, power supply voltage VDD and ground voltage VSS are applied to the power supply line 119 and the ground line 120, respectively. In carrying out an ESD test according to the HBM test standards, there are the case where positive and negative surges are applied to the external connection terminal 101 with the ground voltage VSS used as the reference and the case where positive and negative surges are applied to the external connection terminal 101 with the power supply voltage VDD used as the reference. The status in which the ground voltage VSS is used as the reference means that the voltage of the power supply line 119 is not fixed but placed in an open state and the voltage of the ground line 120 is fixed at the ground voltage VSS. On the other hand, the status in which the power supply voltage VDD is used as the reference means that the voltage of the power supply line 119 is fixed at the power supply voltage VDD and the voltage of the ground line 120 is not fixed but placed in an open state.

To describe the sub-circuit at the right-hand part of the evaluation circuit shown in FIG. 14A, the voltage between the two electrodes of the charge and discharge capacitor 151 is applied to the discharge resistor 153 and the semiconductor integrated circuit device (i.e., the device to be tested 154). At this time, the voltage dropped by the discharge resistor 153 is applied to the external connection terminal 101 connected to the output circuit 103, and an external connection circuit (not shown) connected to an input circuit.

However, if the known semiconductor integrated circuit device shown in FIG. 13 undergoes an ESD test that is carried out according to the HBM test standards (using the ground voltage VSS as the reference), the capabilities of the NMIS transistor 106 in the electrostatic discharge protection circuit 102 and the NMIS transistor 112 in the output circuit 103 to withstand high voltage might be degraded, and/or the NMIS transistors 106 and 112 might be destroyed.

Furthermore, in order to cut down the costs of an LSI chip, the NMIS transistors 106 and 112 have to be reduced in size. Hence, the capabilities of these transistors to withstand high voltage are more likely to be degraded, and/or these transistors are more likely to be destroyed.

SUMMARY OF THE INVENTION

An object of the present invention is to provide a semiconductor integrated circuit device including an electrostatic discharge protection circuit that is resistant to a surge from the outside and has a small area, by implementing means for improving protection against ESD so as to pass a surge test according to HBM test standards.

An inventive semiconductor integrated circuit device includes: an external connection terminal; an electrostatic discharge protection circuit connected to the external connection terminal; a power supply line connected to the electrostatic discharge protection circuit; a ground line connected to the electrostatic discharge protection circuit; and an inter-power supply electrostatic discharge protection circuit that is connected to the power supply line and the ground line, and includes a gate insulating element, wherein the inter-power supply electrostatic discharge protection circuit includes a first substrate potential control circuit capable of controlling a substrate potential of the gate insulating element.

Thus, the gate insulating element can be easily turned ON by the substrate potential control circuit. Therefore, if a positive surge is applied to the external connection terminal, this surge can be discharged through a path that leads from the electrostatic discharge protection circuit to the ground line via the power supply line and the inter-power supply electrostatic discharge protection circuit. Accordingly, the surge can be discharged through two paths, i.e., this path and another path that leads from the electrostatic discharge protection circuit directly to the ground line. As a result, a larger amount of surge current can be discharged and degradation in surge resistance can be prevented.

In one embodiment, the gate insulating element may be a first NMIS transistor whose source is connected to the ground line and whose drain is connected to the power supply line, and the first substrate potential control circuit may include: a capacitor whose one end is connected to the power supply line and whose other end is connected to the substrate of the first NMIS transistor; and a resistor whose one end is connected to the ground line and whose other end is connected to the substrate of the first NMIS transistor.

In such an embodiment, when a positive surge is applied to the external connection terminal and the potential of the power supply line is increased, the substrate potential of the first NMIS transistor is increased by an RC circuit. Therefore, the first NMIS transistor is likely to be turned ON. As a result, the surge passes through the electrostatic discharge protection circuit, the power supply line and the first NMIS transistor, and is then discharged to the ground line.

In another embodiment, the gate insulating element may be a first NMIS transistor whose source is connected to the ground line and whose drain is connected to the power supply line, and the first substrate potential control circuit may include: a first inverter section that is connected at its output to the substrate of the first NMIS transistor, and includes an uneven number of inverters; a resistor whose one end is connected to the power supply line and whose other end is connected to an input of the first inverter section; and a capacitor whose one end is connected to the ground line and whose other end is connected to the input of the first inverter section.

In such an embodiment, when a positive surge is applied to the external connection terminal, the potential of the input of the first inverter section is made equal to that of the ground line by an RC circuit made up of the capacitor and the resistor. Therefore, a low level signal is inputted to the first inverter section, and a high level signal is outputted therefrom. Consequently, the first NMIS transistor is turned ON more quickly.

In still another embodiment, the gate insulating element may be a first NMIS transistor whose source is connected to the ground line and whose drain is connected to the power supply line, and the first substrate potential control circuit may include: a first inverter section that is connected at its output to the substrate of the first NMIS transistor and includes an even number of inverters; a resistor whose one end is connected to the ground line and whose other end is connected to an input of the first inverter section; and a capacitor whose one end is connected to the power supply line and whose other end is connected to the input of the first inverter section.

In such an embodiment, when a positive surge is applied to the external connection terminal, the potential of the input of the first inverter section is increased to be equal to that of the power supply line. Therefore, a high level signal is inputted to the first inverter section, and a high level signal is outputted therefrom. Consequently, the first NMIS transistor is turned ON more quickly.

In still yet another embodiment, the gate insulating element may be a first NMIS transistor whose source is connected to the ground line and whose drain is connected to the power supply line, and the first substrate potential control circuit may include: a first Schmidt trigger circuit connected at its output to the substrate of the first NMIS transistor; a resistor whose one end is connected to the power supply line and whose other end is connected to an input of the first Schmidt trigger circuit; and a capacitor whose one end is connected to the ground line and whose other end is connected to the input of the first Schmidt trigger circuit.

In such an embodiment, once the first NMIS transistor has turned ON, turning OFF of the first NMIS transistor can be delayed due to the hysteresis characteristic of the first Schmidt trigger circuit, and thus the first NMIS transistor can be kept staying in an ON state for a longer period of time.

In another embodiment, the inter-power supply electrostatic discharge protection circuit may further include a first gate potential control circuit connected to a gate of the gate insulating element and being capable of controlling a gate voltage of the gate insulating element. In such an embodiment, when the substrate potential of the gate insulating element is increased, the gate potential is also increased. Accordingly, a potential difference between the substrate potential and the gate potential is reduced. Therefore, a load applied to the gate insulating film of the gate insulating element can be reduced, so that the gate insulating element hardly destroyed.

The first gate potential control circuit preferably includes a resistor whose one end is connected to the gate of the gate insulating element and whose other end is connected to the ground line. In such an embodiment, the gate potential of the gate insulating element can be increased by an RC circuit made up of the resistor and a parasitic capacitance.

If the first gate potential control circuit further includes a capacitor whose one end is connected to the gate of the gate insulating element and whose other end is connected to the resistor of the first gate potential control circuit, an RC circuit is formed of the resistor and the capacitor. By separately providing, as the capacitor of the RC circuit, a capacitor instead of a parasitic capacitance, a value for the capacitance can be adjusted to be a desired value.

In another embodiment, the inter-power supply electrostatic discharge protection circuit may further include: a first PMIS transistor whose source is connected to the power supply line and whose drain is connected to the ground line; and a second substrate potential control circuit capable of controlling the substrate voltage of the first PMIS transistor.

In such an embodiment, the first PMIS transistor can be easily turned ON by the second substrate potential control circuit. Therefore, when a negative surge is applied to the external connection terminal, this surge can be discharged through a path that leads from the electrostatic discharge protection circuit to the power supply line via the ground line and the inter-power supply electrostatic discharge protection circuit. Accordingly, the surge can be discharged through two paths, i.e., this path and another path that leads from the electrostatic discharge protection circuit directly to the power supply line. As a result, a larger amount of surge current can be discharged, and degradation in surge resistance can be prevented.

In still another embodiment, the second substrate potential control circuit may include: a resistor whose one end is connected to the power supply line and whose other end is connected to the substrate of the first PMIS transistor; and a capacitor whose one end is connected to the ground line and whose other end is connected to the substrate of the first PMIS transistor.

In such an embodiment, when a negative surge is applied to the external connection terminal and the potential of the ground line is reduced, the potential of the substrate is also reduced. Therefore, the first PMIS transistor is likely to be turned ON. Thus, the surge passes through the electrostatic discharge protection circuit, the ground line and the first PMIS transistor, and is then discharged to the power supply line.

In still yet another embodiment, the second substrate potential control circuit may further include: a second inverter section that is connected at its output to the substrate of the first PMIS transistor and includes an uneven number of inverters; a capacitor whose one end is connected to the power supply line and whose other end is connected to an input of the second inverter section; and a resistor whose one end is connected to the ground line and whose other end is connected to the input of the second inverter section.

In such an embodiment, when a negative surge is applied to the external connection terminal, the potential of the input of the second inverter section is made higher than that of the ground line by an RC circuit made up of the capacitor and the resistor. Therefore, a high level signal is inputted to the second inverter section, and a low level signal is outputted therefrom. Consequently, the first PMIS transistor is turned ON more quickly.

In another embodiment, the second substrate potential control circuit may include: a second inverter section that is connected at its output to the substrate of the first PMIS transistor, and includes an even number of inverters; a capacitor whose one end is connected to the ground line and whose other end is connected to an input of the second inverter section; and a resistor whose one end is connected to the power supply line and whose other end is connected to the input of the second inverter section.

In such an embodiment, when a negative surge is applied to the external connection terminal, the potential of the input of the second inverter section is reduced to be equal to that of the ground line. Therefore, a low level signal is inputted to the second inverter section, and a low level signal is outputted therefrom. Consequently, the first PMIS transistor is turned ON more quickly.

In still another embodiment, the second substrate potential control circuit may include: a second Schmidt trigger circuit connected at its output to the substrate of the first PMIS transistor; a capacitor whose one end is connected to the power supply line and whose other end is connected to an input of the second Schmidt trigger circuit; and a resistor whose one end is connected to the ground line and whose other end is connected to the input of the second Schmidt trigger circuit.

In such an embodiment, when a negative surge is applied to the external connection terminal and once the first PMIS transistor has turned ON, turning OFF of the first PMIS transistor can be delayed due to the hysteresis of the Schmidt trigger circuit, and thus the first PMTS transistor can be kept staying in an ON state for a longer period of time.

In another embodiment, the inter-power supply electrostatic discharge protection circuit may further include a second gate potential control circuit connected to a gate of the first PMIS transistor and being capable of controlling a gate voltage of the first PMIS transistor. In such an embodiment, when the substrate potential of the first PMIS transistor is dropped, the gate potential is also dropped. Accordingly, a potential difference between the substrate potential and the gate potential is reduced. Therefore, a load applied to the gate insulating film of the gate insulating element can be reduced, so that the gate insulating element is hardly destroyed.

The second gate potential control circuit preferably includes a resistor whose one end is connected to the gate of the first PMIS transistor and whose other end is connected to the power supply line. In such an embodiment, the gate potential of the gate insulating element can be reduced by an RC circuit made up of the resistor and a parasitic capacitance.

If the second gate potential control circuit further includes a capacitor whose one end is connected to the gate of the first PMIS transistor and the resistor of the second gate potential control circuit, an RC circuit is formed of the resistor and the capacitor. By separately providing, as a capacitance of the RC circuit, a capacitor instead of a parasitic capacitance, a value for the capacitance can be adjusted to be a desired value.

In still yet another embodiment, the inventive semiconductor integrated circuit device may further include an input buffer circuit connected to the external connection terminal.

In another embodiment, the inventive semiconductor integrated circuit device may further include: an output circuit connected to the external connection terminal; and an output prebuffer circuit connected to the output circuit.

In still another embodiment, the output prebuffer circuit may include a first prebuffer circuit having at its last stage a first prebuffer connected to the power supply line and a second prebuffer circuit having at its last stage a second prebuffer connected to the power supply line, and the output circuit may include: a second PMIS transistor whose source is connected to the power supply line, whose drain is connected to the external connection terminal, whose gate is connected to an output terminal of the first prebuffer, and whose n-type substrate region is connected to the power supply line; and a second NMIS transistor whose source is connected to the ground line, whose drain is connected to the external connection terminal, whose gate is connected to an output terminal of the second prebuffer, and whose p-type substrate region is connected to the ground line.

In still yet another embodiment, the inventive semiconductor integrated circuit device may further include an internal circuit connected to the external connection terminal.

In another embodiment, the electrostatic discharge protection circuit may include: a third PMIS transistor whose source is connected to the power supply line, whose drain is connected to the external connection terminal, and whose n-type substrate region is connected to the power supply line; and a third NMIS transistor whose source is connected to the ground line, whose drain is connected to the external connection terminal, and whose p-type substrate region is connected to the ground line.

In still another embodiment, the inventive semiconductor integrated circuit device may further include: a resistor interposed between the gate of the third PMIS transistor and the power supply line; and a resistor interposed between the gate of the third NMIS transistor and the ground line.

In still yet another embodiment, the electrostatic discharge protection circuit may include: a first PN diode whose one end is connected to the power supply line and whose other end is connected to the external connection terminal; and a second PN diode whose one end is connected to the ground line and whose other end is connected to the external connection terminal.

BRIEF DESCRIPTION OF THE DRAWINGS

FIG. 13 is an electric circuit diagram illustrating the configuration of an output circuit of a known semiconductor integrated circuit device including an electrostatic discharge protection circuit, and the periphery of the output circuit.

DESCRIPTION OF THE PREFERRED EMBODIMENTS

Examination

Figure 1:
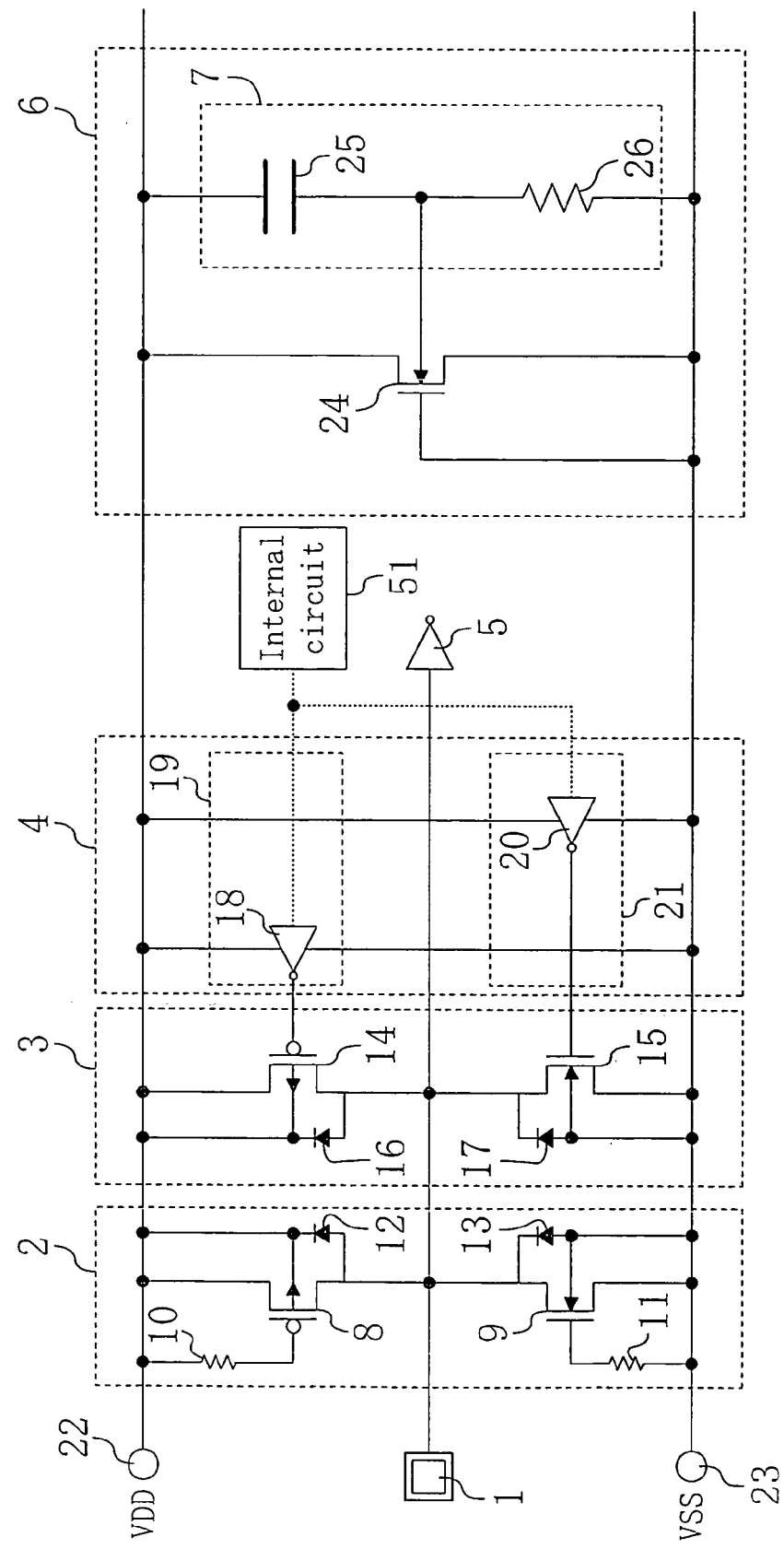
FIG. 1 is a circuit diagram illustrating the configuration of a semiconductor integrated circuit device including an electrostatic discharge protection circuit according to a first embodiment of the present invention.

The present inventors examined the reasons why the NMIS transistors 106 and 112 are destroyed and/or the capabilities of the transistors to withstand high voltage are degraded in a known semiconductor integrated circuit device shown in FIG. 13 as follows.

In the status in which the power supply line 119 is placed in an open state and the voltage of the ground line 120 is fixed at the ground voltage VSS, there are two kinds of discharge paths for surge current if a positive electrical charge is applied to the external connection terminal 101. A first path sequentially passes through the external connection terminal 101, a parasitic forward diode 109 (i.e., the pn junction between the drain region and the substrate region of the PMIS transistor 105), a parasitic forward diode 113 (i.e., the pn junction between the drain region and the substrate region of the PMIS transistor 111), the power supply line 119, the NMIS transistor 123 of the inter-power supply electrostatic discharge protection circuit 122, and the ground line 120. On the other hand, a second path sequentially passes through the external connection terminal 101, the NMIS transistor 106 of the electrostatic discharge protection circuit 102, the NMIS transistor 112 of the output circuit 103, and the ground line 120.

In this case, the power supply line 119 is connected to the external connection terminal 101 via the parasitic diodes 109 and 113. If the potential of the external connection terminal 101 is denoted by Vpad and the total of built-in voltages of the parasitic diodes 109 and 113 is denoted by Vbiv, the potential of the power supply line 119 is denoted by Vpad-Vbiv.

The potential Vpad of the external connection terminal 101 in this case is determined by the snapback characteristics of the NMIS transistors 106 and 112. Since the potential of the power supply line 119 is reduced by the built-in voltages Vbiv of the parasitic diodes 109 and 113 and is thus represented by the expression Vpad-Vbiv, the breakdown voltage of the inter-power supply electrostatic discharge protection circuit 122 is unlikely to be reached. Therefore, the NMIS transistor 123 within the inter-power supply electrostatic discharge protection circuit 122 remains in an OFF state and is unlikely to be turned ON.

Accordingly, when a positive electrical charge is applied to the external connection terminal 101, the above-described first path is unlikely to be brought into conduction and thus the second path is often selected. That is, only the path passing through the external connection terminal 101, the NMIS transistor 106 of the electrostatic discharge protection circuit 102, the NMIS transistor 112 of the output circuit 103, and the ground line 120 is selected, which undesirably degrades the capabilities of these transistors to withstand high voltage.

First Embodiment

Hereinafter, a first embodiment of the present invention will be described with reference to the drawings. FIG. 1 is a circuit diagram illustrating the configuration of a semiconductor integrated circuit device including an electrostatic discharge protection circuit according to the first embodiment. Note that FIG. 1 illustrates the configuration of an input/output section of the semiconductor integrated circuit device, and the periphery of the input/output section.

As shown in FIG. 1, the semiconductor integrated circuit device of this embodiment includes: an external connection terminal 1; an electrostatic discharge protection circuit 2; an output circuit 3; an output prebuffer circuit 4; an input buffer circuit 5; an internal circuit 51; and an inter-power supply electrostatic discharge protection circuit 6. The electrostatic discharge protection circuit 2 and the inter-power supply electrostatic discharge protection circuit 6 are provided in order to protect the output circuit 3, the internal circuit 51 and the input buffer circuit 5 from a surge penetrated from the external connection terminal 1. This embodiment is characterized in that a substrate potential control circuit 7 is provided in the inter-power supply electrostatic discharge protection circuit 6. By providing the substrate potential control circuit 7, it becomes possible to control the substrate voltage of an NMIS transistor 24 in the inter-power supply electrostatic discharge protection circuit 6 during an ESD test.

The electrostatic discharge protection circuit 2 is provided between the external connection terminal 1 and the output circuit 3, and includes: a PMTS transistor 8; an NMIS transistor 9; a resistor 10; and a resistor 11. The PMIS transistor 8 includes: a source connected to a power supply line 22 through which a power supply voltage VDD is supplied; a gate connected to the power supply line 22 with the resistor 10 interposed therebetween; a drain connected to the external connection terminal 1; and a substrate region (n-well) connected to the power supply line 22. On the other hand, the NMIS transistor 9 includes: a source connected to a ground line 23; a gate connected to the ground line 23 with the resistor 11 interposed therebetween; a drain connected to the external connection terminal 1; and a substrate region (p-well) connected to the ground line 23.

The output circuit 3 is provided between the electrostatic discharge protection circuit 2 and the output prebuffer circuit 4, and includes a PMIS transistor 14 and an NMIS transistor 15. The PMIS transistor 14 includes: a source connected to the power supply line 22; a gate connected to an output terminal of a prebuffer 18 of the output prebuffer circuit 4; a drain connected to the external connection terminal 1; and a substrate region (n-well) connected to the power supply line 22. On the other hand, the NMIS transistor 15 includes: a source connected to the ground line 23; a gate connected to an output terminal of a prebuffer 20 of the output prebuffer circuit 4; a drain connected to the external connection terminal 1; and a substrate region (p-well) connected to the ground line 23.

The output prebuffer circuit 4 amplifies an output signal from the internal circuit 51, and is provided between the internal circuit 51 and the output circuit 3. The output prebuffer circuit 4 includes: a prebuffer circuit 19 provided at its last stage with the prebuffer 18; and a prebuffer circuit 21 provided at its last stage with the prebuffer 20. The prebuffer 18 is provided with: a terminal which is connected to the power supply line 22 and through which a power supply voltage is supplied; a ground terminal connected to the ground line 23; an output terminal connected to the gate of the PMIS transistor 14 of the output circuit 3; and an input terminal connected to the internal circuit 51. On the other hand, the prebuffer 20 is provided with: a terminal which is connected to the power supply line 22 and through which a power supply voltage is supplied; a ground terminal connected to the ground line 23; an output terminal connected to the gate of the NMIS transistor 15 of the output circuit 3; and an input terminal connected to the internal circuit 51. Note that the prebuffer circuits 19 and 21 are each provided with prebuffers whose number is determined in accordance with the degree of amplification of an output signal from the internal circuit 51. Output signals whose levels are the same or opposite to each other are sent from the output terminal of the prebuffer 18 at the last stage of the prebuffer circuit 19 and that of the prebuffer 20 at the last stage of the prebuffer circuit 21.

An input section of the input buffer circuit 5 is connected to the external connection terminal 1, while an output section of the input buffer circuit 5 is connected to the internal circuit 51 and/or other internal circuit (not shown).

The inter-power supply electrostatic discharge protection circuit 6 is provided between the power supply line 22 and the ground line 23, and includes the NMIS transistor 24 and the substrate potential control circuit 7. The NMIS transistor 24 includes: a source connected to the ground line 23 for grounding; a drain connected to the power supply line 22 through which the power supply voltage VDD is supplied; a gate connected to the ground line 23 through which a ground voltage VSS is supplied; and a substrate connected to an output terminal of the substrate potential control circuit 7.

The substrate potential control circuit 7 is provided between the power supply line 22 and the ground line 23, and includes a capacitor 25 and a resistor 26. One end of the capacitor 25 is connected to the power supply line 22 through which the power supply voltage VDD is supplied, while the other end of the capacitor 25 is connected to the substrate of the NMIS transistor 24. On the other hand, one end of the resistor 26 is connected to the ground is connected to the substrate of the NMIS transistor 24. Note that in this embodiment, a capacitor is used as the capacitor 25. However, according to the present invention, as for the capacitor 25, wiring capacitance, gate capacitance, junction capacitance and the like may be alternatively used. Furthermore, as for the resistor 26, wiring resistance, gate resistance, transistor resistance or the like may be alternatively used.

Figure 14A:
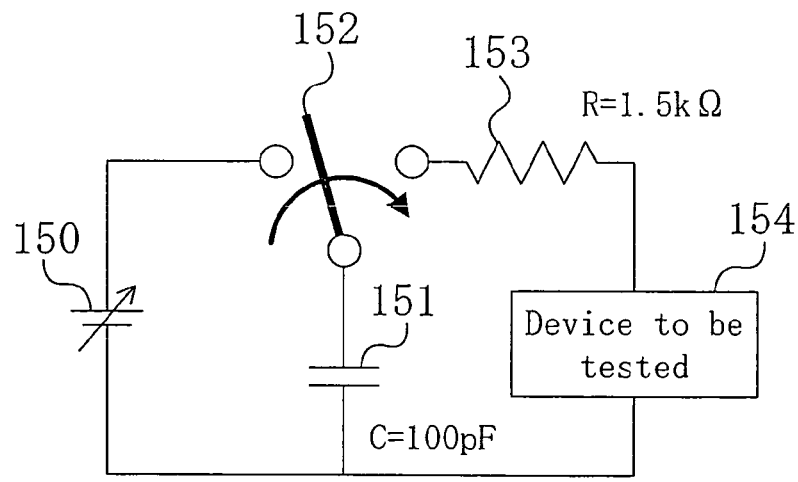
FIGS. 14A and 14B are a circuit diagram illustrating an evaluation circuit for carrying out an ESD test according to HBM test standards, and a graph showing an HBM discharge waveform obtained in carrying out the test according to the MIL test standards, respectively.
Figure 14B:
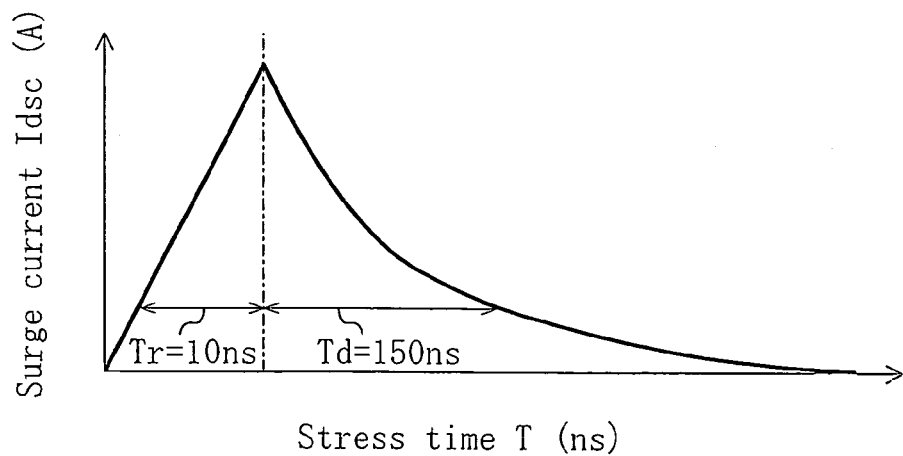

Next, an operation of the above-described semiconductor integrated circuit device during an ESD test will be described with reference to FIGS. 14A and 14B again.

First, the semiconductor integrated circuit device of this embodiment (which is used as the device to be tested 154 in FIG. 14A) is placed in the evaluation circuit. At this time, the power supply line 22 of the semiconductor integrated circuit device shown in FIG. 1 is placed in an open state, and the voltage of the ground line 23 is fixed at the voltage VSS. Then, the selector switch 152 is operated so that the charge power supply 150 allows electrical charges to be accumulated in the charge and discharge capacitor 151. Thereafter, one electrode of the charge and discharge capacitor 151 is connected to the discharge resistor 153 via the selector switch 152. Thus, a positive electrical charge is applied to the external connection terminal 1 shown in FIG. 1.

In this case, in the path leading from the external connection terminal 1 to the power supply line 22, the pn junction between the drain region and the substrate region (n-well) of the PMIS transistor 8 serves as a parasitic forward diode 12, and the pn junction between the drain region and the substrate region (n-well) of the PMIS transistor 14 serves as a parasitic forward diode 16. On the other hand, in the path leading from the external connection terminal 1 to the ground line 23, the pn junction between the drain region and the substrate region (p-well) of the NMIS transistor 9 serves as a parasitic backward diode 13, and the pn junction between the drain region and the substrate region (p-well) of the NMIS transistor 15 serves as a parasitic backward diode 17.

A positive surge applied to the external connection terminal 1 flows into the power supply line 22 through the parasitic forward diodes 12 and 16, and the potential of the power supply line 22 is increased. In this embodiment, the capacitor 25 is connected between the power supply line 22 and the substrate of the NMIS transistor 24. Furthermore, the resistor 26 is provided between the ground line 23 and the substrate of the NMIS transistor 24. Thus, if the potential of the power supply line 22 is increased, the substrate potential of the NMIS transistor 24 is also increased by an RC circuit made up of the capacitor 25 and the resistor 26. Therefore, the NMIS transistor 24 is likely to be turned ON. If the NMIS transistor 24 is turned ON, the positive electrical charge supplied to the external connection terminal 1 is discharged toward the ground line 23. In this case, the NMIS transistor 24 contributes to this discharge also as a parasitic bipolar transistor.

If surge current cannot be discharged by using only the above-described path, the NMIS transistors 9 and 15 are turned ON as soon as the breakdown voltages of the NMIS transistors 9 and 15 are reached. Thus, surge current sequentially passes through the external connection terminal 1, the NMIS transistors 9 and 15, and the ground line 23.

As described above, the semiconductor integrated circuit device of this embodiment can have two discharge paths for surge current. As a result, a larger amount of surge current can be discharged and degradation in surge resistance can be prevented.

Second Embodiment

Figure 2:
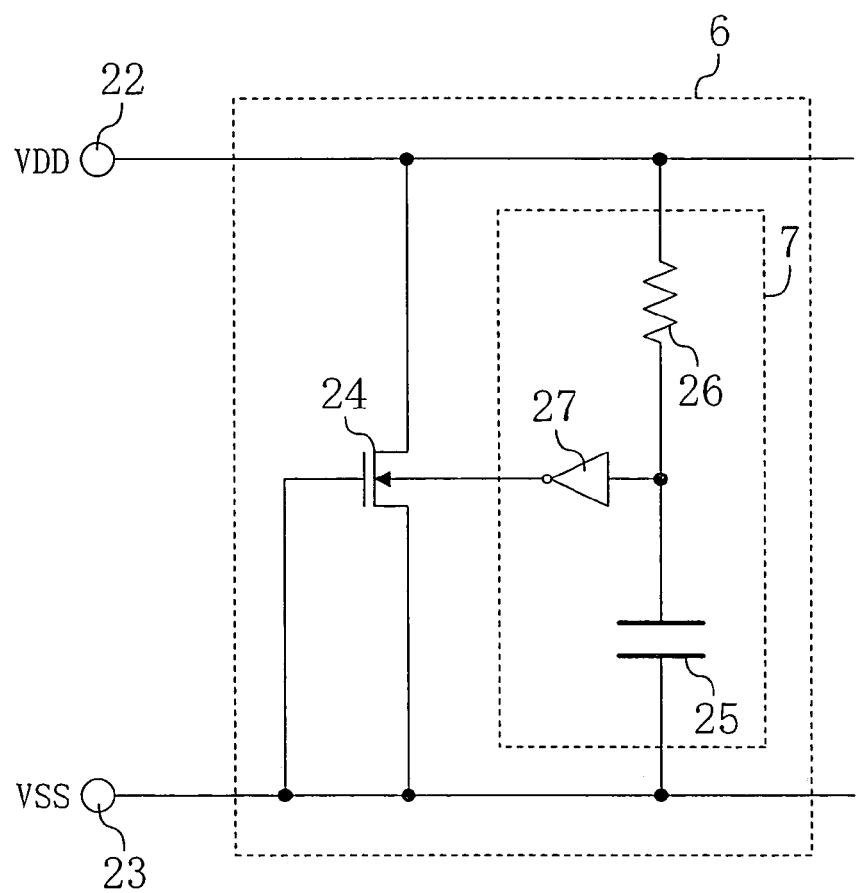
FIG. 2 is a circuit diagram illustrating the configuration of an inter-power supply electrostatic discharge protection circuit of a semiconductor integrated circuit device according to a second embodiment of the present invention.

Hereinafter, a second embodiment of the present invention will be described with reference to the drawings. The semiconductor integrated circuit device of the second embodiment is similar in configuration to that of the first embodiment except for an inter-power supply electrostatic discharge protection circuit, and therefore, description of part of the semiconductor integrated circuit device other than the inter-power supply electrostatic discharge protection circuit will be omitted. FIG. 2 is a circuit diagram illustrating the configuration of the inter-power supply electrostatic discharge protection circuit 6 of the semiconductor integrated circuit device according to the second embodiment.

As shown in FIG. 2, the inter-power supply electrostatic discharge protection circuit 6 of this embodiment is provided between a power supply line 22 and a ground line 23 and includes an NMIS transistor 24 and a substrate potential control circuit 7. The NMIS transistor 24 includes: a source connected to the ground line 23 for grounding; a drain connected to the power supply line 22 through which a power supply voltage VDD is supplied; and a gate connected to the ground line 23 for grounding.

The substrate potential control circuit 7 is provided between the power supply line 22 and the ground line 23 and includes a capacitor 25, a resistor 26 and an inverter 27. One end of the resistor 26 is connected to the power supply line 22 through which the power supply voltage VDD is supplied, while the other end of the resistor 26 is connected to an input terminal of the inverter 27. On the other hand, one end of the capacitor 25 is connected to the ground line 23 through which a ground voltage VSS is supplied, while the other end of the capacitor 25 is connected to the input terminal of the input terminal of the inverter 27. An output terminal of the inverter 27 is connected to the substrate of the NMIS transistor 24. In this embodiment, a capacitor is used as the capacitor 25. However, according to the present invention, as for the capacitor 25, wiring capacitance, gate capacitance, junction capacitance and the like may be alternatively used. Furthermore, as for the resistor 26, wiring resistance, gate resistance, transistor resistance or the like may be alternatively used.

Next, an operation of the above-described semiconductor integrated circuit device during an ESD test will be described with reference to FIGS. 14A and 14B again. Since the semiconductor integrated circuit device of the second embodiment is similar in configuration to the semiconductor integrated circuit device shown in FIG. 1 except for the inter-power supply electrostatic discharge protection circuit 6, the description will be made also with reference to FIG. 1.

First, the semiconductor integrated circuit device of this embodiment (which is used as the device to be tested 154 in FIG. 14A) is placed in the evaluation circuit. At this time, the power supply line 22 of the semiconductor integrated circuit device shown in FIG. 1 is placed in an open state, and the voltage of the ground line 23 is fixed at the voltage VSS. Then, the selector switch 152 is operated so that the charge power supply 150 allows electrical charges to be accumulated in the charge and discharge capacitor 151. Thereafter, one electrode of the charge and discharge capacitor 151 is connected to the discharge resistor 153 via the selector switch 152. Thus, a positive electrical charge is applied to the external connection terminal 1 shown in FIG. 1.

In this case, in the path leading from the external connection terminal 1 to the power supply line 22, the pn junction between the drain region and the substrate region (n-well) of the PMIS transistor 8 serves as the parasitic forward diode 12, and the pn junction between the drain region and the substrate region (n-well) of the PMIS transistor 14 serves as the parasitic forward diode 16. On the other hand, in the path leading from the external connection terminal 1 to the ground line 23, the pn junction between the drain region and the substrate region (p-well) of the NMIS transistor 9 serves as the parasitic backward diode 13, and the pn junction between the drain region and the substrate region (p-well) of the NMIS transistor 15 serves as the parasitic backward diode 17.

A positive electrical charge applied to the external connection terminal 1 flows into the power supply line 22 through the parasitic forward diodes 12 and 16, and the potential of the power supply line 22 is increased. In this embodiment, as shown in FIG. 2, the resistor 26 and the inverter 27 are connected between the power supply line 22 and the substrate of the NMIS transistor 24. Since the resistor 26 is provided, the potential of the input section of the inverter 27 becomes lower than that of the power supply line 22. Therefore, a low level signal is inputted to the inverter 27, and a high level signal corresponding to the potential of the power supply line 22 is outputted from the inverter 27. Accordingly, the NMIS transistor 24 in the inter-power supply electrostatic discharge protection circuit 6 is quickly turned ON. In this case, if a low level signal has reached the inverter 27, a high level signal is immediately outputted from the inverter 27, and therefore, the NMIS transistor 24 can be turned ON more quickly. If the NMIS transistor 24 is turned ON, the positive electrical charge supplied to the external connection terminal 1 is discharged toward the ground line 23. The NMIS transistor 24 contributes to this discharge also as a parasitic bipolar transistor. Since the capacitor 25 is provided between the input section of the inverter 27 and the ground line 23, the NMIS transistor 24 is prevented from turning ON during a normal operation.

If surge current cannot be discharged by using only the above-described path, the NMIS transistors 9 and 15 are turned ON as soon as the breakdown voltages of the NMIS transistors 9 and 15 are reached. Thus, surge current sequentially passes through the external connection terminal 1, the NMIS transistors 9 and 15, and the ground line 23.

As described above, the semiconductor integrated circuit device of this embodiment can have two discharge paths for surge current. As a result, a larger amount of surge current can be discharged and degradation in surge resistance can be prevented.

This embodiment has been described on the supposition that one inverter 27 is provided. Alternatively, a plurality of inverters (e.g., an uneven number of inverters) may be provided in this embodiment. Optionally, an even number of inverters may be provided. In such a case, it is sufficient to reverse the position of the resistor 26 and that of the capacitor 25 in the above-described structure. If a plurality of inverters are provided in this manner, the NMIS transistor 24 can be turned ON even more quickly.

Third Embodiment

Figure 3:
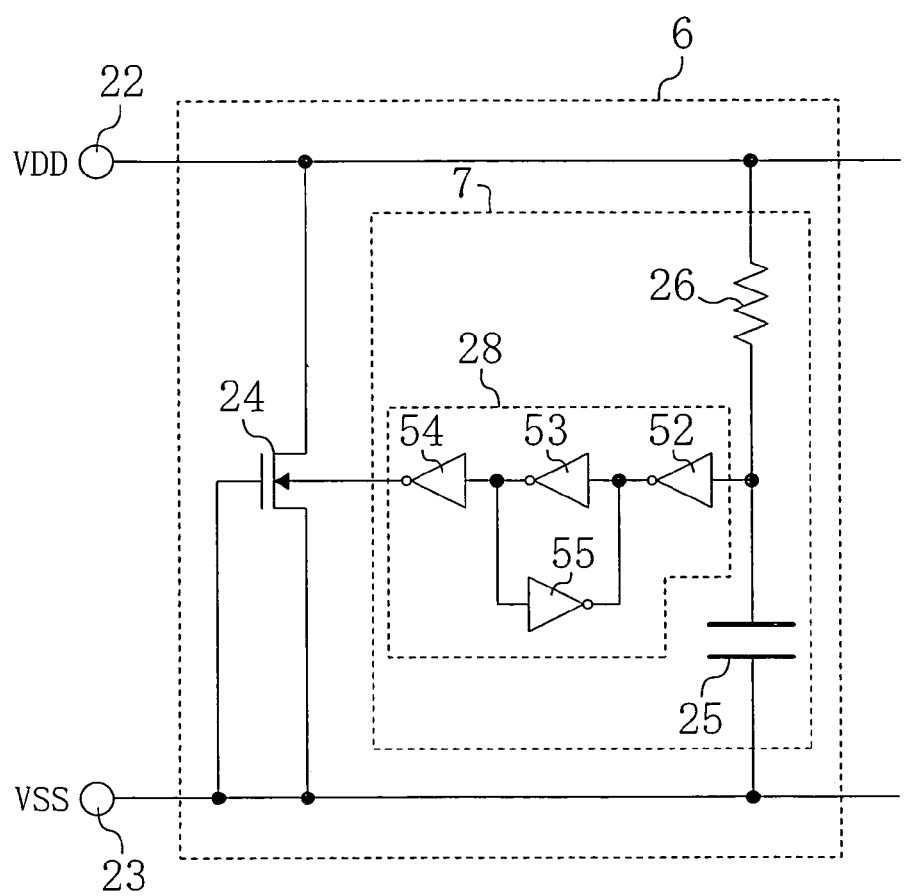
FIG. 3 is a circuit diagram illustrating the configuration of an inter-power supply electrostatic discharge protection circuit of a semiconductor integrated circuit device according to a third embodiment of the present invention.

Hereinafter, a third embodiment of the present invention will be described with reference to the drawings. The semiconductor integrated circuit device of the third embodiment is similar in configuration to that of the first embodiment except for an inter-power supply electrostatic discharge protection circuit, and therefore, description of part of the semiconductor integrated circuit other than the inter-power supply electrostatic discharge protection circuit will be omitted. FIG. 3 is a circuit diagram illustrating the configuration of the inter-power supply electrostatic discharge protection circuit 6 of the semiconductor integrated circuit device according to the third embodiment.

As shown in FIG. 3, the inter-power supply electrostatic discharge protection circuit 6 of this embodiment is provided between a power supply line 22 and a ground line 23, and includes an NMIS transistor 24 and a substrate potential control circuit 7. The NMIS transistor 24 includes: a source connected to the ground line 23 through which a ground voltage VSS is supplied; a drain connected to the power supply line 22 through which a power supply voltage VDD is supplied; and a gate connected to the ground line 23 through which a ground voltage VSS is supplied.

The substrate potential control circuit 7 is provided between the power supply line 22 and the ground line 23 and includes a capacitor 25, a resistor 26 and a Schmidt trigger circuit 28. One end of the capacitor 25 is connected to the ground line 23 through which the ground potential VSS is supplied, while the other end of the capacitor 25 is connected to an input terminal of the Schmidt trigger circuit 28. On the other hand, one end of the resistor 26 is connected to the power supply line 22 through which the power supply voltage VDD is supplied, while the other end of the resistor 26 is connected to the input terminal of the Schmidt trigger circuit 28. An output terminal of the Schmidt trigger circuit 28 is connected to the substrate of the NMIS transistor 24. In this case, as for the capacitor 25, wiring capacitance, gate capacitance, junction capacitance and the like may be alternatively used. Furthermore, as for the resistor 26, wiring resistance, gate resistance, transistor resistance or the like may be alternatively used.

In the Schmidt trigger circuit 28, inverters 52, 53 and 54 are connected in series, and an inverter 55 is connected so as to return an output from the inverter 53. The inverters 53 and 55 constitute a latch circuit. The configuration of the Schmidt trigger circuit 28 is shown by way of example. In the present invention, some other circuit that is configured differently and exhibits hysteresis characteristic may alternatively be used.

Next, an operation of the above-described semiconductor integrated circuit device during an ESD test will be described with reference to FIGS. 14A and 14B again. Since the semiconductor integrated circuit device of the third embodiment is similar in configuration to the semiconductor integrated circuit device shown in FIG. 1 except for the inter-power supply electrostatic discharge protection circuit 6, the description will be made also with reference to FIG. 1.

First, the semiconductor integrated circuit device of this embodiment (which is used as the device to be tested 154 in FIG. 14A) is placed in the evaluation circuit. At this time, the power supply line 22 of the semiconductor integrated circuit device shown in FIG. 1 is placed in an open state and the voltage of the ground line 23 is fixed at the voltage VSS. Then, the selector switch 152 is operated so that the charge power supply 150 allows electrical charges to be accumulated in the charge and discharge capacitor 151. Thereafter, one electrode of the charge and discharge capacitor 151 is connected to the discharge resistor 153 via the selector switch 152. Thus, a positive electrical charge is applied to the external connection terminal 1 shown in FIG. 1.

In this case, in the path leading from the external connection terminal 1 to the power supply line 22, the pn Junction between the drain region and the substrate region (n-well) of the PMIS transistor 8 serves as the parasitic forward diode 12, and the pn junction between the drain region and the substrate region (n-well) of the PMIS transistor 14 serves as the parasitic forward diode 16. On the other hand, in the path leading from the external connection terminal 1 to the ground line 23, the pn junction between the drain region and the substrate region (p-well) of the NMIS transistor 9 serves as the parasitic backward diode 13, and the pn junction between the drain region and the substrate region (p-well) of the NMIS transistor 15 serves as the parasitic backward diode 17.

A positive surge applied to the external connection terminal 1 flows into the power supply line 22 through the parasitic forward diodes 12 and 16, and the potential of the power supply line 22 is increased. In this embodiment, as shown in FIG. 3, the resistor 26 and the Schmidt trigger circuit 28 are connected between the power supply line 22 and the substrate of the NMIS transistor 24. Since the Schmidt trigger circuit 28 exhibits hysteresis characteristic, once the NMIS transistor 24 has turned ON, turning OFF of the NMIS transistor 24 can be delayed. Therefore, the NMIS transistor 24 can remain in an ON state for a longer period of time.

Besides, since the Schmidt trigger circuit 28 is provided, the resistance of the resistor 26 can be reduced. Accordingly, during a normal operation, current consumption in the inter-power supply electrostatic discharge protection circuit 6 can be kept at a low level.

Fourth Embodiment

Figure 4:
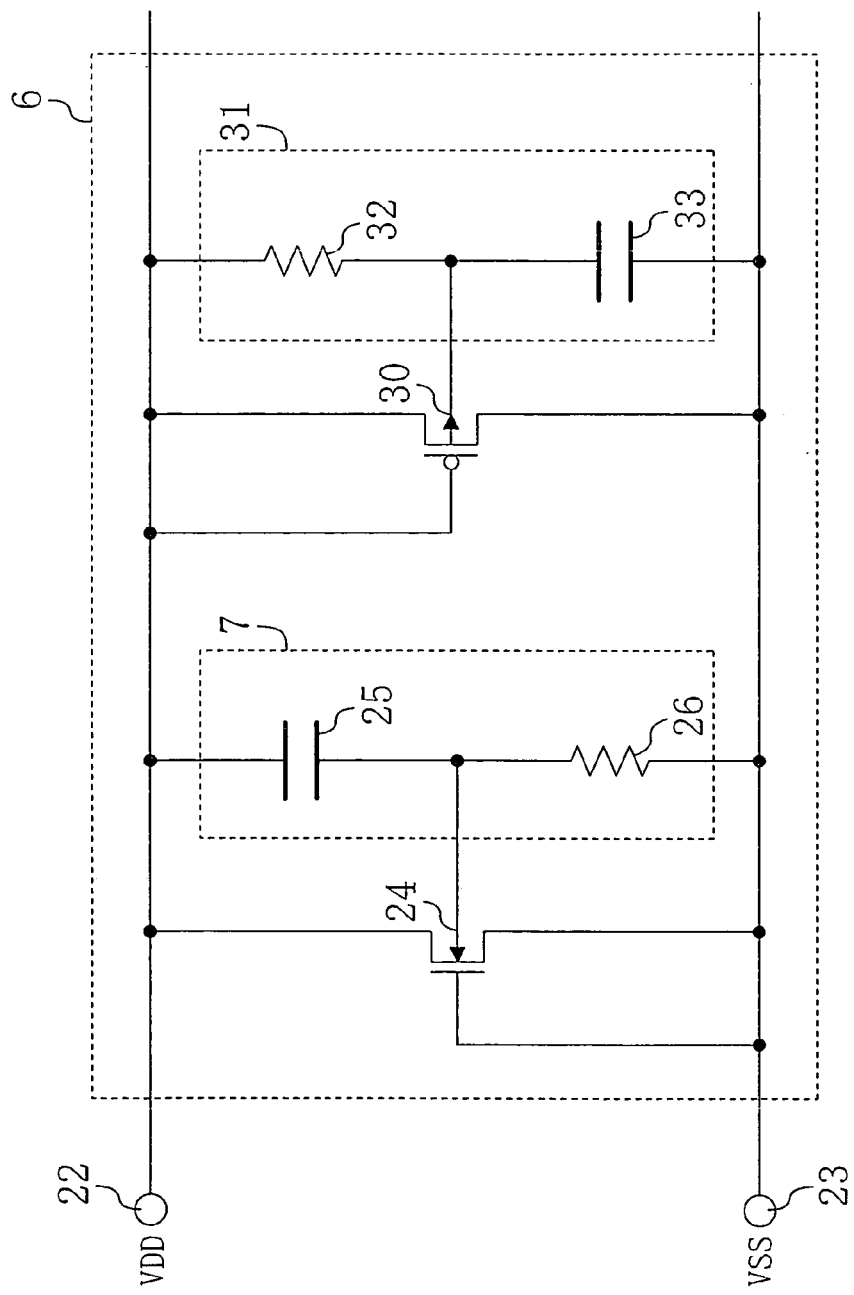
FIG. 4 is a circuit diagram illustrating the configuration of an inter-power supply electrostatic discharge protection circuit of a semiconductor integrated circuit device according to a fourth embodiment of the present invention.

Hereinafter, a fourth embodiment of the present invention will be described with reference to the drawings. The semiconductor integrated circuit device of the fourth embodiment is similar in configuration to that of the first embodiment except for an inter-power supply electrostatic discharge protection circuit, and therefore, description of part of the semiconductor integrated circuit device other than the inter-power supply electrostatic discharge protection circuit will be omitted. FIG. 4 is a circuit diagram illustrating the configuration of the inter-power supply electrostatic discharge protection circuit 6 of the semiconductor integrated circuit device according to the fourth embodiment.

As shown in FIG. 4, the inter-power supply electrostatic discharge protection circuit 6 of this embodiment is provided between a power supply line 22 and a ground line 23 and includes an NMIS transistor 24, a PMIS transistor 30, and substrate potential control circuits 7 and 31. The NMIS transistor 24 includes: a source connected to the ground line 23 through which a ground voltage VSS is supplied; a drain connected to the power supply line 22 through which a power supply voltage VDD is supplied; and a gate connected to the ground line 23 through which a ground voltage VSS is supplied; and a substrate connected to an output terminal of the substrate potential control circuit 31. On the other hand, the PMIS transistor 30 includes: a drain connected to the ground line 23 through which the ground voltage VSS is supplied; a source connected to the power supply line 22 through which the power supply voltage VDD is supplied; and a gate connected to the power supply line 22 through which the power supply voltage VDD is supplied; and a substrate connected to an output terminal of the substrate potential control circuit 31.

The substrate potential control circuit 7 is provided between the power supply line 22 and the ground line 23 and includes a capacitor 25 and a resistor 26. One end of the capacitor 25 is connected to the power supply line 22 through which the power supply voltage VDD is supplied, while the other end of the capacitor 25 is connected to the substrate of the NMIS transistor 24. On the other hand, one end of the resistor 26 is connected to the ground line 23 through which the ground voltage VSS is supplied, while the other end of the resistor 26 is connected to the substrate of the NMIS transistor 24. As for the capacitor 25, not only a capacitor but also wiring capacitance, gate capacitance, junction capacitance or the like may be used. Furthermore, as for the resistor 26, wiring resistance, gate resistance, transistor resistance or the like may be alternatively used.

The substrate potential control circuit 31 is provided between the power supply line 22 and the ground line 23 and includes a capacitor 33 and a resistor 32. One end of the resistor 32 is connected to the power supply line 22 through which the power supply voltage VDD is supplied, while the other end of the resistor 32 is connected to the substrate of the PMIS transistor 30. On the other hand, one end of the capacitor 33 is connected to the ground line 23 through which the ground voltage VSS is supplied, while the other end of the capacitor 33 is connected to the substrate of the PMIS transistor 30. As for the capacitor 25, not only a capacitor but also wiring capacitance, gate capacitance, junction capacitance or the like may be used. Furthermore, as for the resistor 26, wiring resistance, gate resistance, transistor resistance or the like may be alternatively used.

Next, an operation of the above-described semiconductor integrated circuit device during an ESD test will be described with reference to FIGS. 14A and 14B again. Since the semiconductor integrated circuit device of the fourth embodiment is similar in configuration to the semiconductor integrated circuit device shown in FIG. 1 except for the inter-power supply electrostatic discharge protection circuit 6, the description will be made also with reference to FIG. 1.

As for carrying out the ESD test, there is the case where the power supply line 22 is placed in an open state and the voltage of the ground line 23 is fixed at the voltage VSS as described in the first through third embodiments, and there is also the opposite case, i.e., the case where the voltage of the power supply line 22 is fixed at the voltage VDD and the ground line 23 is placed in an open state. The semiconductor integrated circuit device of this embodiment is adaptable to both the cases. A specific description will be made about this below.

First, the semiconductor integrated circuit device of this embodiment (which is used as the device to be tested 154 in FIG. 14A) is placed in the evaluation circuit. At this time, the power supply line 22 of the semiconductor integrated circuit device shown in FIG. 1 is placed in an open state, and the voltage of the ground line 23 is fixed at the voltage VSS. Then, the selector switch 152 is operated so that the charge power supply 150 allows electrical charges to be accumulated in the charge and discharge capacitor 151. Thereafter, one electrode of the charge and discharge capacitor 151 is connected to the discharge resistor 153 via the selector switch 152. Thus, a positive electrical charge is applied to the external connection terminal 1 shown in FIG. 1. In this case, the device is operated in the same way as in the first embodiment, thereby enabling the discharge of surge.

Subsequently, a negative electrical charge is applied to the external connection terminal 1, with the ground line 23 of the semiconductor integrated circuit device shown in FIG. 1 being placed in an open state and the voltage of the power supply line 22 being fixed at the voltage VDD.

In this case, in the path leading from the external connection terminal 1 to the ground line 23, the pn junction between the drain region and the substrate region (p-well) of the NMIS transistor 9 serves as the parasitic forward diode 13, and the pn junction between the drain region and the substrate region (p-well) of the NMIS transistor 15 serves as the parasitic forward diode 17. On the other hand, in the path leading from the external connection terminal 1 to the power supply line 22, the pn junction between the drain region and the substrate region (n-well) of the PMIS transistor 8 serves as the parasitic backward diode 12, and the pn junction between the drain region and the substrate region (n-well) of the PMIS transistor 14 serves as the parasitic backward diode 16.

A negative electrical charge applied to the external connection terminal 1 flows into the ground line 23 through the parasitic forward diodes 13 and 17, and the potential of the ground line 23 is decreased. In this embodiment, as shown in FIG. 4, the capacitor 33 is connected between the ground line 23 and the substrate of the PMIS transistor 30. Furthermore, the resistor 32 is provided between the power supply line 22 and the substrate of the PMIS transistor 30. Thus, when the potential of the ground line 23 is decreased, the substrate potential of the PMIS transistor 30 is also decreased. Therefore, the PMIS transistor 30 is likely to be turned ON. If the PMIS transistor 30 is turned ON, the negative electrical charge supplied to the external connection terminal 1 is discharged to the power supply line 22. In this case, the PMIS transistor 30 contributes to this discharge also as a parasitic bipolar transistor.

If surge current cannot be discharged by using only the above-described path, the PMIS transistors 8 and 14 are turned ON as soon as the potential of the ground line 23 is decreased and the breakdown voltages of the PMIS transistors 8 and 14 are reached. Thus, surge current sequentially passes through the external connection terminal 1, the PMIS transistor 8 of the electrostatic discharge protection circuit 2, the PMIS transistor 14 of the output circuit 3, and the power supply line 22 in this order.

As described above, the semiconductor integrated circuit device of this embodiment can have two discharge paths for surge current even if a positive or negative electrical charge is applied to the external connection terminal 1. As a result, a larger amount of surge current can be discharged, and degradation in surge resistance can be prevented.

Fifth Embodiment

Figure 5:
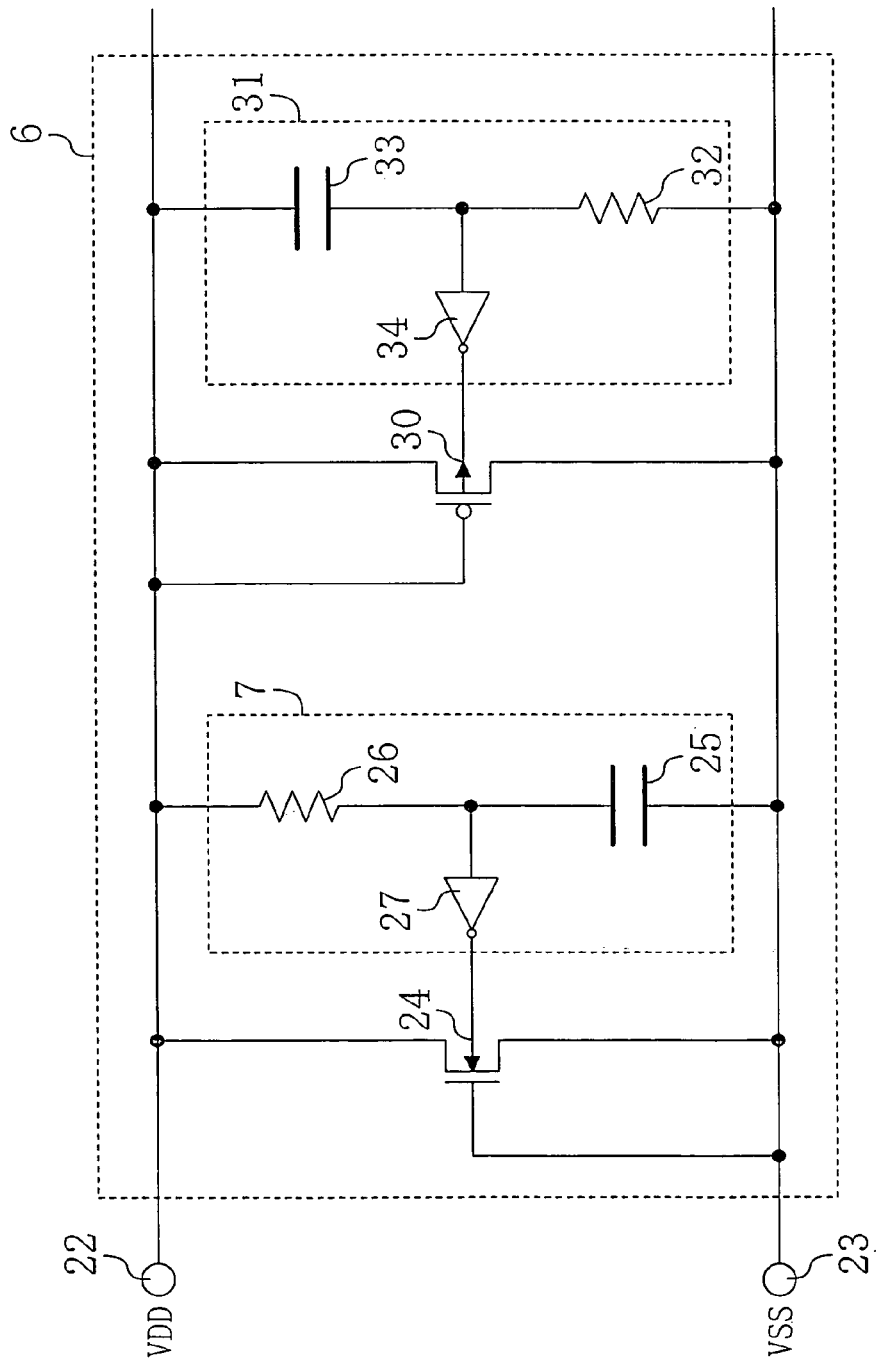
FIG. 5 is a circuit diagram illustrating the configuration of an inter-power supply electrostatic discharge protection circuit of a semiconductor integrated circuit device according to a fifth embodiment of the present invention.

Hereinafter, a fifth embodiment of the present invention will be described with reference to the drawings. The semiconductor integrated circuit device of the fifth embodiment is similar in configuration to that of the first embodiment except for an inter-power supply electrostatic discharge protection circuit, and therefore, description of part of the semiconductor integrated circuit device other than the inter-power supply electrostatic discharge protection circuit will be omitted. FIG. 5 is a circuit diagram illustrating the configuration of the inter-power supply electrostatic discharge protection circuit 6 of the semiconductor integrated circuit device according to the fifth embodiment.

As shown in FIG. 5, the inter-power supply electrostatic discharge protection circuit 6 of this embodiment is provided between a power supply line 22 and a ground line 23 and includes an NMIS transistor 24, a PMIS transistor 30, and substrate potential control circuits 7 and 31. The NMIS transistor 24 includes: a source connected to the ground line 23 through which a ground voltage VSS is supplied; a drain connected to the power supply line 22 through which a power supply voltage VDD is supplied; and a gate connected to the power supply line 22 through which the ground voltage VDD is supplied; a substrate connected to an output terminal of the substrate potential control circuit 7. On the other hand, the PMIS transistor 30 includes: a drain connected to the ground line 23 through which the ground voltage VSS is supplied; a source connected to the power supply line 22 through which the power supply voltage VDD is supplied; and a gate connected to the power supply line 22 through which the power supply voltage VDD is supplied; and a substrate connected to an output terminal of the substrate potential control circuit 31.

The substrate potential control circuit 7 is provided between the power supply line 22 and the ground line 23 and includes a capacitor 25, a resistor 26 and an inverter 27. One end of the resistor 26 is connected to the power supply line 22 through which the power supply voltage VDD is supplied, while the other end of the resistor 26 is connected to an input terminal of the inverter 27. On the other hand, one end of the capacitor 25 is connected to the ground line 23 through which the ground voltage VSS is supplied, while the other end of the capacitor 25 is connected to the input terminal of the inverter 27. An output terminal of the inverter 27 is connected to the substrate of the NMIS transistor 24. As for the capacitor 25, not only a capacitor but also wiring capacitance, gate capacitance, junction capacitance or the like may be used. Furthermore, as for the resistor 26, wiling resistance, gate resistance, transistor resistance or the like may be alternatively used.

The substrate potential control circuit 31 is provided between the power supply line 22 and the ground line 23 and includes a resistor 32, a capacitor 33 and an inverter 34. One end of the capacitor 33 is connected to the power supply line 22 through which the power supply voltage VDD is supplied, while the other end of the capacitor 33 is connected to an input terminal of the inverter 34. On the other hand, one end of the resistor 32 is connected to the ground line 23 through which the ground voltage VSS is supplied, while the other end of the resistor 32 is connected to the input terminal of the inverter 34. An output terminal of the inverter 34 is connected to the substrate of the PMIS transistor 30. As for the capacitor 33, not only a capacitor but also wiring capacitance, gate capacitance, junction capacitance or the like may be used. Furthermore, as for the resistor 32, wiring resistance, gate resistance, transistor resistance or the like may be alternatively used.

Next, an operation of the above-described semiconductor integrated circuit device during an ESD test will be described with reference to FIGS. 14A and 14B again. Since the semiconductor integrated circuit device of the fifth embodiment is similar in configuration to the semiconductor integrated circuit device shown in FIG. 1 except for the inter-power supply electrostatic discharge protection circuit 6, the description will be made also with reference to FIG. 1.

As in the fourth embodiment, the semiconductor integrated circuit device of the fifth embodiment is adaptable to the case where the power supply line 22 is placed in an open state and the voltage of the ground line 23 is fixed at the voltage VSS and to the case where the voltage of the power supply line 22 is fixed at the voltage VDD and the ground line 23 is placed in an open state. A specific description will be made about this below.

First, the semiconductor integrated circuit device of this embodiment (which is used as the device to be tested 154 in FIG. 14A) is placed in the evaluation circuit. At this time, the power supply line 22 of the semiconductor integrated circuit device shown in FIG. 1 is placed in an open state, and the voltage of the ground line 23 is fixed at the voltage VSS. Then, the selector switch 152 is operated so that the charge power supply 150 allows electrical charges to be accumulated in the charge and discharge capacitor 151. Thereafter, one electrode of the charge and discharge capacitor 151 is connected to the discharge resistor 153 via the selector switch 152. Thus, a positive electrical charge is applied to the external connection terminal 1 shown in FIG. 1. In this case, the device is operated in the same way as in the second embodiment, thereby enabling the discharge of surge.

Subsequently, a negative electrical charge is applied to the external connection terminal 1, with the ground line 23 of the semiconductor integrated circuit device shown in FIG. 1 being placed in an open state and the voltage of the power supply line 22 being fixed at the voltage VSS.

In this case, in the path leading from the external connection terminal 1 to the ground line 23, the pn junction between the drain region and the substrate region (p-well) of the NMIS transistor 9 serves as the parasitic forward diode 13, and the pn junction between the drain region and the substrate region (p-well) of the NMIS transistor 15 serves as the parasitic forward diode 17. On the other hand, in the path leading from the external connection terminal 1 to the power supply line 22, the pn junction between the drain region and the substrate region (n-well) of the PMIS transistor 8 serves as the parasitic backward diode 12, and the pn junction between the drain region and the substrate region (n-well) of the PMIS transistor 14 serves as the parasitic backward diode 16.

A negative electrical charge applied to the external connection terminal 1 flows into the ground line 23 through the parasitic forward diodes 13 and 17, and the potential of the ground line 23 is reduced. In this embodiment, as shown in FIG. 5, the resistor 32 and the inverter 34 are connected between the ground line 23 and the substrate of the PMIS transistor 30. Since the resistor 32 is provided, the potential of the input section of the inverter 34 becomes higher than that of the ground line 23. Thus, a high level signal is inputted to the inverter 34, and a low level signal corresponding to the potential of the ground line 23 is outputted from the inverter 34. Accordingly, the PMIS transistor 30 is likely to be turned ON. If the PMIS transistor 30 is turned ON, the negative electrical charge supplied to the external connection terminal 1 is discharged to the power supply line 22. In this case, the PMIS transistor 30 contributes to this discharge also as a parasitic bipolar transistor.

If surge current cannot be discharged by using only the above-described path, the PMIS transistors 8 and 14 are turned ON as soon as the potential of the ground line 23 is decreased and the breakdown voltages of the PMIS transistors 8 and 14 are reached. Thus, surge current sequentially passes through the external connection terminal 1, the PMIS transistor 8 of the electrostatic discharge protection circuit 2, the PMIS transistor 14 of the output circuit 3, and the power supply line 22 in this order.

As described above, the semiconductor integrated circuit device of this embodiment can have two discharge paths for surge current even if a positive or negative electrical charge is applied to the external connection terminal 1. As a result, a larger amount of surge current can be discharged, and degradation in surge resistance can be prevented.

Sixth Embodiment

Figure 6:
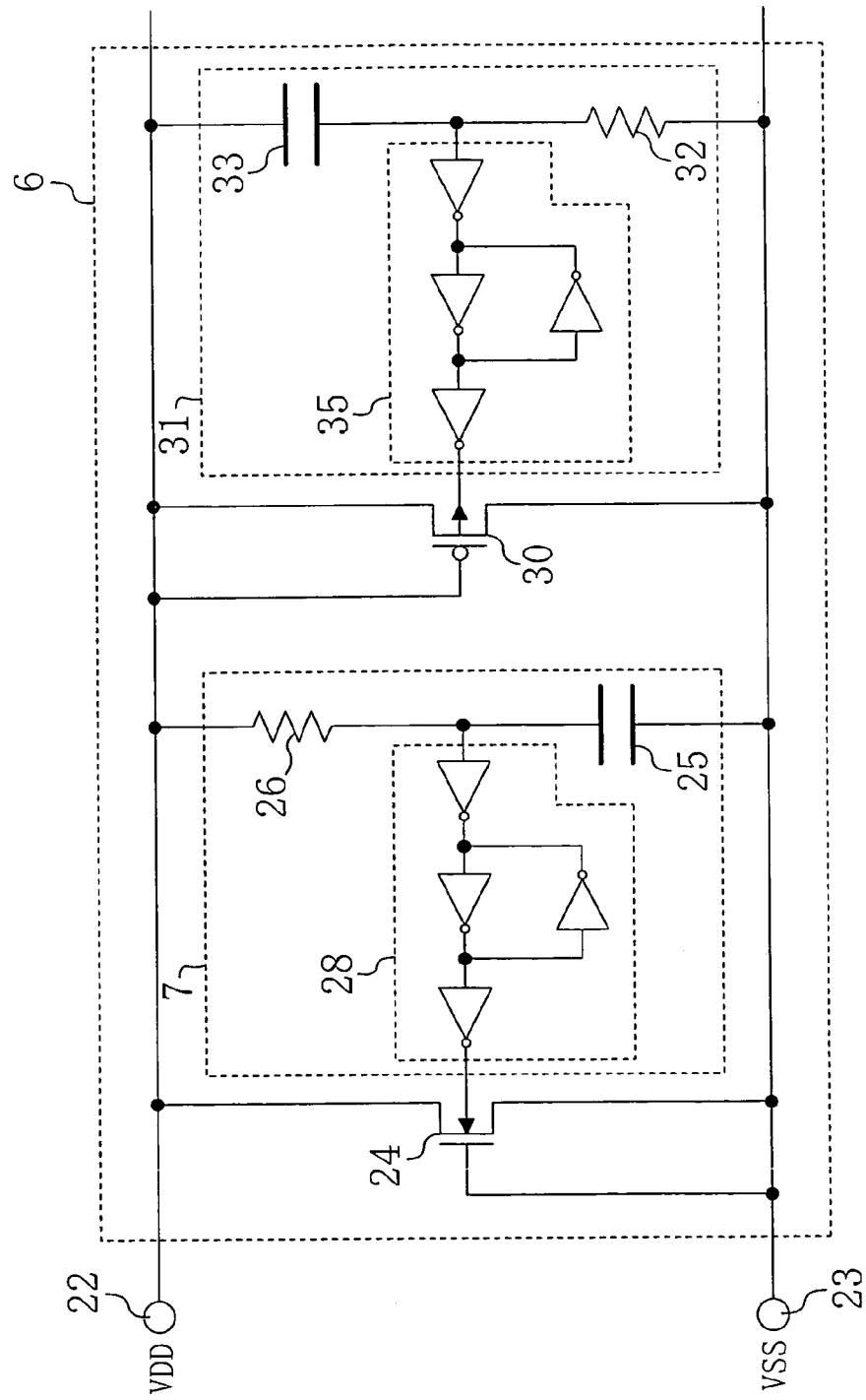
FIG. 6 is a circuit diagram illustrating the configuration of an inter-power supply electrostatic discharge protection circuit of a semiconductor integrated circuit device according to a sixth embodiment of the present invention.

Hereinafter, a sixth embodiment of the present invention will be described with reference to the drawings. The semiconductor integrated circuit device of the sixth embodiment is similar in configuration to that of the first embodiment except for an inter-power supply electrostatic discharge protection circuit, and therefore, description of part of the semiconductor circuit device other than the inter-power supply electrostatic discharge protection circuit will be omitted. FIG. 6 is a circuit diagram illustrating the configuration of the inter-power supply electrostatic discharge protection circuit 6 of the semiconductor integrated circuit device according to the sixth embodiment.

As shown in FIG. 6, the inter-power supply electrostatic discharge protection circuit 6 of this embodiment is provided between a power supply line 22 and a ground line 23, and includes: an NMIS transistor 24; a PMIS transistor 30; and substrate potential control circuits 7 and 31. The NMIS transistor 24 includes: a source connected to the ground line 23 through which a ground voltage VSS is supplied; a drain connected to the power supply line 22 through which a power supply voltage VDD is supplied; and a gate connected to the ground line 23 through which the ground voltage VSS is supplied; and a substrate connected to an output terminal of the substrate potential control circuit 7. On the other hand, the PMIS transistor 30 includes: a drain connected to the ground line 23 for grounding; a source connected to the power supply line 22 through which the power supply voltage VDD is supplied; and a gate connected to the power supply line 22 through which the power supply voltage VDD is supplied; and a substrate connected to an output terminal of the substrate potential control circuit 31.

The substrate potential control circuit 7 is provided between the power supply line 22 and the ground line 23 and includes a capacitor 25, a resistor 26 and a Schmidt trigger circuit 28. One end of the resistor 26 is connected to the power supply line 22 through which the power supply voltage VDD is supplied, while the other end of the resistor 26 is connected to an input terminal of the Schmidt trigger circuit 28. On the other hand, one end of the capacitor 25 is connected to the ground line 23 through which the ground voltage VSS is supplied, while the other end of the capacitor 25 is connected to the input terminal of the Schmidt trigger circuit 28. An output terminal of the Schmidt trigger circuit 28 is connected to the substrate of the NMIS transistor 24. As for the capacitor 25, not only a capacitor but also wiring capacitance, gate capacitance, junction capacitance or the like may be used. Furthermore, as for the resistor 26, wiring resistance, gate resistance, transistor resistance or the like may be alternatively used.

The substrate potential control circuit 31 is provided between the power supply line 22 and the ground line 23 and includes a resistor 32, a capacitor 33 and a Schmidt trigger circuit 35. One end of the capacitor 33 is connected to the power supply line 22 through which the power supply voltage VDD is supplied, while the other end of the capacitor 33 is connected to an input terminal of the Schmidt trigger circuit 35. On the other hand, one end of the resistor 32 is connected to the ground line 23 through which the ground voltage VSS is supplied, while the other end of the resistor 32 is connected to the input terminal of the Schmidt trigger circuit 35. As for the capacitor 33, not only a capacitor but also wiring capacitance, gate capacitance, junction capacitance or the like may be used. Furthermore, as for the resistor 32, wiring resistance, gate resistance, transistor resistance or the like may be alternatively used.

Next, an operation of the above-described semiconductor integrated circuit device during an ESD test will be described with reference to FIGS. 14A and 14B again. Since the semiconductor integrated circuit device of the sixth embodiment is similar in configuration to the semiconductor integrated circuit device shown in FIG. 1 except for the inter-power supply electrostatic discharge protection circuit 6, the description will be made also with reference to FIG. 1.

Like the fourth and fifth embodiments, the semiconductor integrated circuit device of the sixth embodiment is adaptable to the case where the power supply line 22 is placed in an open state and the voltage of the ground line 23 is fixed at the voltage VSS, and is also adaptable to the case where the voltage of the power supply line 22 is fixed at the voltage VDD and the ground line 23 is placed open state. A specific description will be made about this below.

First, the semiconductor integrated circuit device of this embodiment (which is used as the device to be tested 154 in FIG. 14A) is placed in the evaluation circuit. At this time, the power supply line 22 of the semiconductor integrated circuit device shown in FIG. 1 is placed in an open state, and the voltage of the ground line 23 is fixed at the voltage VSS. Then, the selector switch 152 is operated so that the charge power supply 150 allows electrical charges to be accumulated in the charge and discharge capacitor 151. Thereafter, one electrode of the charge and discharge capacitor 151 is connected to the discharge resistor 153 via the selector switch 152. Thus, a positive electrical charge is applied to the external connection terminal 1 shown in FIG. 1. In this case, the device is operated in the same way as in the third embodiment, thereby enabling the discharge of surge.

Subsequently, a negative electrical charge is applied to the external connection terminal 1, with the ground line 23 of the semiconductor integrated circuit device shown in FIG. 1 being placed in an open state and the voltage of the power supply line 22 being fixed at the voltage VDD.

In this case, in the path leading from the external connection terminal 1 to the ground line 23, the pn junction between the drain region and the substrate region (p-well) of the NMIS transistor 9 serves as the parasitic forward diode 13, and the pn junction between the drain region and the substrate region (p-well) of the NMIS transistor 15 serves as the parasitic forward diode 17. On the other hand, in the path leading from the external connection terminal 1 to the power supply line 22, the pn junction between the drain region and the substrate region (n-well) of the PMIS transistor 8 serves as the parasitic backward diode 12, and the pn junction between the drain region and the substrate region (p-well) of the PMIS transistor 14 serves as the parasitic backward diode 16.

A negative electrical charge applied to the external connection terminal 1 flows into the ground line 23 through the parasitic forward diodes 13 and 17, and the potential of the ground line 23 is decreased. In this embodiment, as shown in FIG. 6, the resistor 32 and the Schmidt trigger circuit 35 are connected between the ground line 23 and the substrate of the PMIS transistor 30. The Schmidt trigger circuit 35 exhibits hysteresis characteristic. Therefore, once the PMIS transistor 30 has turned ON, the turning OFF of the PMIS transistor 30 can be delayed. Accordingly, the PMIS transistor 30 can remain in an ON state for a longer period of time.

Besides, since the Schmidt trigger circuit 35 is provided, the resistance of the resistor 32 can be reduced. Accordingly, during a normal operation, current consumption in the inter-power supply electrostatic discharge protection circuit 6 can be kept at a low level.

Seventh Embodiment

Figure 7:
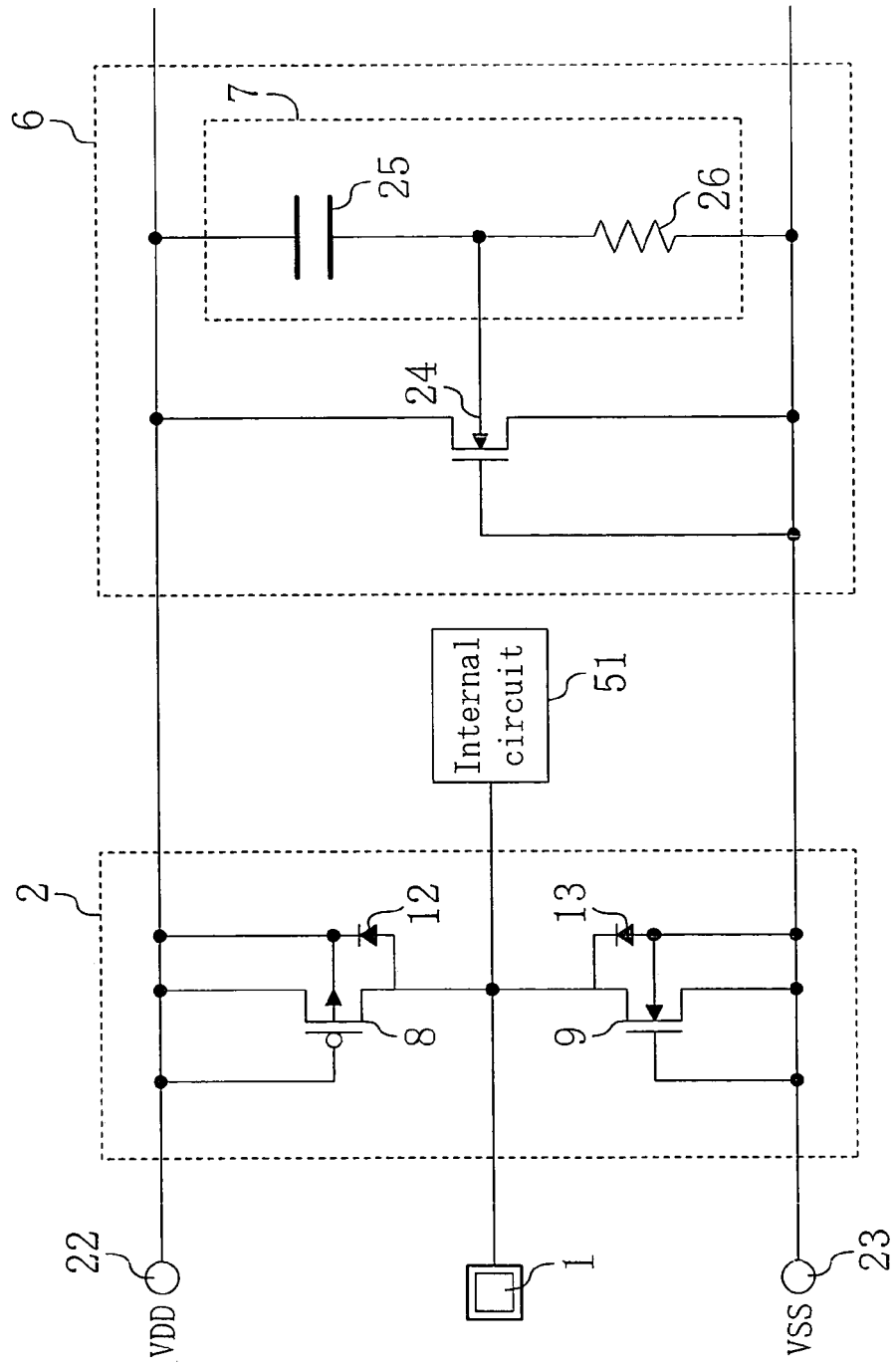
FIG. 7 is a circuit diagram illustrating the configuration of a semiconductor integrated circuit device including an electrostatic discharge protection circuit according to a seventh embodiment of the present invention.

Hereinafter, a seventh embodiment of the present invention will be described with reference to the drawings. FIG. 7 is a circuit diagram illustrating the configuration of a semiconductor integrated circuit device including an electrostatic discharge protection circuit according to the seventh embodiment. In this embodiment, an input circuit will be described instead of the input/output circuit described in each of the first through sixth embodiments.

As shown in FIG. 7, the semiconductor integrated circuit device of this embodiment includes: an external connection terminal 1; an electrostatic discharge protection circuit 2; an internal circuit 51; and an inter-power supply electrostatic discharge protection circuit 6. The electrostatic discharge protection circuit 2 and the inter-power supply electrostatic discharge protection circuit 6 are provided in order to protect the internal circuit 51 from a surge penetrated from the external connection terminal 1. In the inter-power supply electrostatic discharge protection circuit 6, a substrate potential control circuit 7 is provided. By providing the substrate potential control circuit 7, it becomes possible to control the substrate voltage of an NMIS transistor 24 in the inter-power supply electrostatic discharge protection circuit 6 during an ESD test.

The electrostatic discharge protection circuit 2 is provided between the external connection terminal 1 and the internal circuit 51 and includes a PMIS transistor 8 and an NMIS transistor 9. The PMIS transistor 8 includes: a source connected to a power supply line 22 through which a power supply voltage VDD is supplied; a gate connected to the power supply line 22; a drain connected to the external connection terminal 1; and a substrate region (n-well) connected to the power supply line 22. On the other hand, the NMIS transistor 9 includes: a source connected to a ground line 23 through which a ground voltage VSS is supplied; a gate connected to the ground line 23; a drain connected to the external connection terminal 1; and a substrate region (p-well) connected to the ground line 23.

The inter-power supply electrostatic discharge protection circuit 6 is provided between the power supply line 22 and the ground line 23 and includes the NMIS transistor 24 and the substrate potential control circuit 7. The NMIS transistor 24 includes: a source connected to the ground line 23 through which the ground voltage VSS is supplied; a drain connected to the power supply line 22 through which the power supply voltage VDD is supplied; and a gate connected to the ground line 23 through which the ground voltage VSS is supplied; and a substrate connected to an output terminal of the substrate potential control circuit 7.

The substrate potential control circuit 7 is provided between the power supply line 22 and the ground line 23, and includes a capacitor 25 and a resistor 26. One end of the capacitor 25 is connected to the power supply line 22 through which the power supply voltage VDD is supplied, while the other end of the capacitor 25 is connected to the substrate of the NMIS transistor 24. On the other hand, one end of the resistor 26 is connected to the ground line 23 through which the ground voltage VSS is supplied, while the other end of the resistor 26 is connected to the substrate of the NMIS transistor 24. In this embodiment, a capacitor is used as the capacitor 25. However, according to the present invention, as for the capacitor 25, wiring capacitance, gate capacitance, junction capacitance and the like may be alternatively used. Furthermore, as for the resistor 26, wiring resistance, gate resistance, transistor resistance or the like may be alternatively used.

Next, an operation of the above-described semiconductor integrated circuit device during an ESD test will be described with reference to FIGS. 14A and 14B again.

First, the semiconductor integrated circuit device of this embodiment (which is used as the device to be tested 154 in FIG. 14A) is placed in the evaluation circuit. At this time, the power supply line 22 of the semiconductor integrated circuit device shown in FIG. 7 is placed in an open state, and the voltage of the ground line 23 is fixed at the voltage VSS. Then, the selector switch 152 is operated so that the charge power supply 150 allows electrical charges to be accumulated in the charge and discharge capacitor 151. Thereafter, one electrode of the charge and discharge capacitor 151 is connected to the discharge resistor 153 via the selector switch 152. Thus, a positive electrical charge is applied to the external connection terminal 1 shown in FIG. 7.

In this case, in the path leading from the external connection terminal 1 to the power supply line 22, the pn junction between the drain region and the substrate region (n-well) of the PMIS transistor 8 serves as a parasitic forward diode 12. On the other hand, in the path leading from the external connection terminal 1 to the ground line 23, the pn junction between the drain region and the substrate region (p-well) of the NMIS transistor 9 serves as a parasitic backward diode 13.

A positive electrical charge applied to the external connection terminal 1 flows into the power supply line 22 through the parasitic forward diode 12, and the potential of the power supply line 22 is increased. In this embodiment, the capacitor 25 is connected between the power supply line 22 and the substrate of the NMIS transistor 24. Furthermore, the resistor 26 is provided between the ground line 23 and the substrate of the NMIS transistor 24.

Thus, when the potential of the power supply line 22 is increased, the gate potential of the NMIS transistor 24 is also increased. Therefore, the NMIS transistor 24 is likely to be turned ON. If the NMIS transistor 24 is turned ON, the positive electrical charge supplied to the external connection terminal 1 is discharged toward the ground line 23. In this case, the NMIS transistor 24 contributes to this discharge also as a parasitic bipolar transistor.

In the known device, a positive surge applied to an external connection terminal flows through a parasitic backward diode of an NMIS transistor in an electrostatic discharge protection circuit, and the positive surge is then discharged to a ground line 23. However, since transistor size has been reduced in recent years, the NMIS transistor might be destroyed. In contrast, in the present invention, a surge can be discharged to the ground line 23 through the NMIS transistor 24 in the inter-power supply electrostatic discharge protection circuit 6. As a result, a larger amount of surge current can be discharged, and degradation in surge resistance can be prevented.

Note that this embodiment has been described on the supposition that the input circuit is provided with the substrate potential control circuit 7 formed in the same way as that in the first embodiment. However, according to the present invention, the substrate potential control circuit 7 may be formed in the same way as any of the substrate potential control circuits in the second through sixth embodiments. Even if any of these substrate potential control circuits is used, it is possible to achieve the effect of preventing degradation in surge resistance.

Eighth Embodiment

Figure 8:
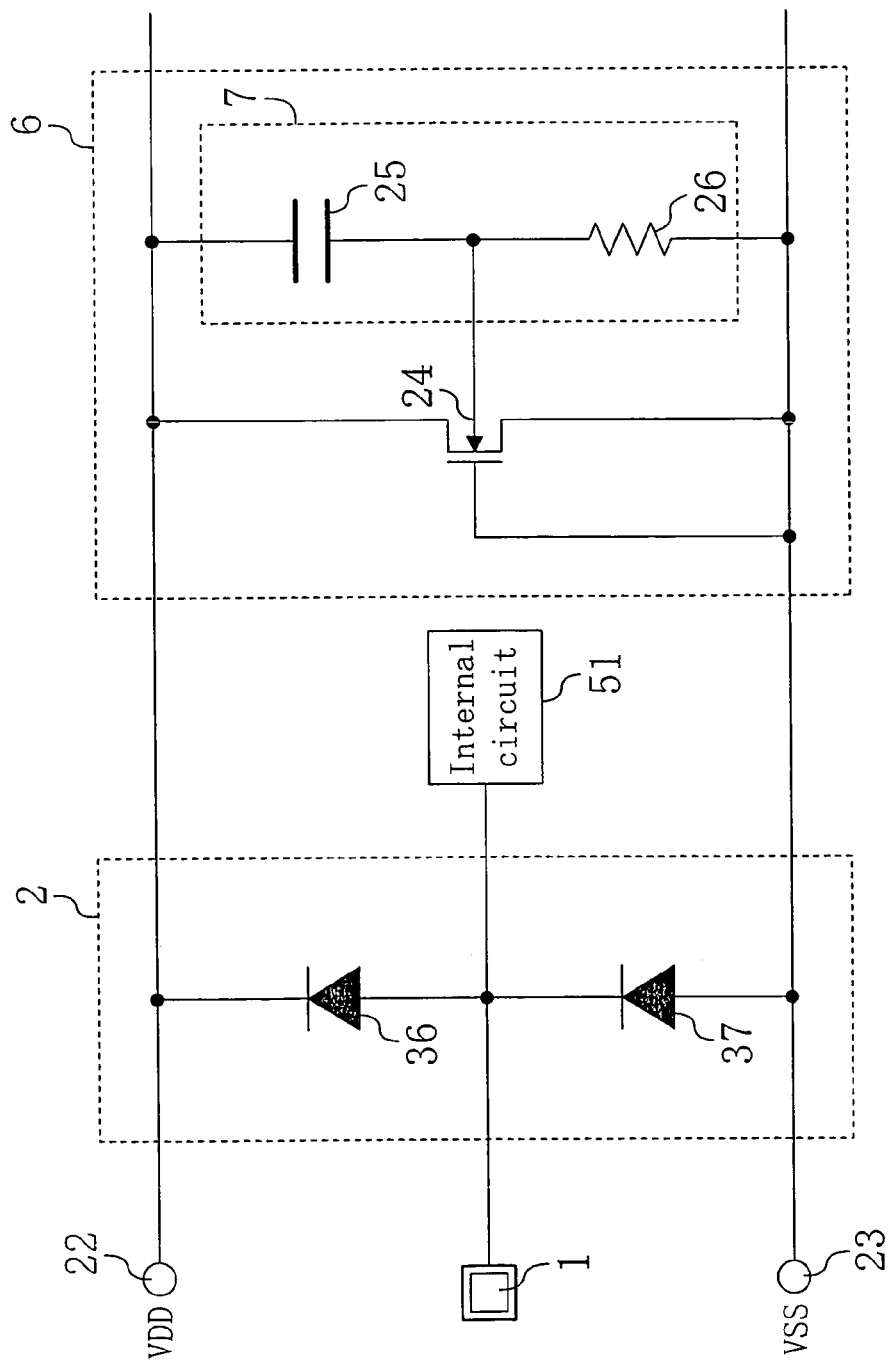
FIG. 8 is a circuit diagram illustrating the configuration of a semiconductor integrated circuit device including an electrostatic discharge protection circuit according to an eighth embodiment of the present invention.

Hereinafter, an eighth embodiment of the present invention will be described with reference to the drawings. FIG. 8 is a circuit diagram illustrating the configuration of a semiconductor integrated circuit device including an electrostatic discharge protection circuit according to the eighth embodiment.

As shown in FIG. 8, the semiconductor integrated circuit device of this embodiment includes a substrate potential control circuit 7 as in the seventh embodiment. The eighth embodiment differs from the seventh embodiment in that an electrostatic discharge protection circuit 2 in the eighth embodiment is provided with PN diodes 36 and 37 instead of the PMIS transistor 8 and the NMIS transistor 9 (which are shown in FIG. 7). The configuration of each circuit will be described below in detail.

As shown in FIG. 8, the semiconductor integrated circuit device of this embodiment includes: an external connection terminal 1; the electrostatic discharge protection circuit 2; an internal circuit 51; and an inter-power supply electrostatic discharge protection circuit 6. The electrostatic discharge protection circuit 2 and the inter-power supply electrostatic discharge protection circuit 6 are provided in order to protect the internal circuit 51 from a surge penetrated from the external connection terminal 1.

The electrostatic discharge protection circuit 2 is provided between the external connection terminal 1 and the internal circuit 51 and includes the PN diodes 36 and 37. The PN diode 36 includes: a cathode connected to a power supply line 22 through which a power supply voltage VDD is supplied; and an anode connected to the external connection terminal 1. On the other hand, the PN diode 37 includes: an anode connected to a ground line 23 through which a ground voltage VSS is supplied; and a cathode connected to the external connection terminal 1.

The inter-power supply electrostatic discharge protection circuit 6 is provided between the power supply line 22 and the ground line 23 and includes an NMIS transistor 24 and the substrate potential control circuit 7. The NMIS transistor 24 includes: a source connected to the ground line 23 through which the ground voltage VSS is supplied; a drain connected to the power supply line 22 through which the power supply voltage VDD is supplied; and a gate connected to the ground line 23 through which the ground voltage VSS is supplied; and a substrate connected to an output terminal of the substrate potential control circuit 7.

The substrate potential control circuit 7 is provided between the power supply line 22 and the ground line 23 and includes a capacitor 25 and a resistor 26. One end of the capacitor 25 is connected to the power supply line 22 through which the power supply voltage VDD is supplied, while the other end of the capacitor 25 is connected to the substrate of the NMIS transistor 24. On the other hand, one end of the resistor 26 is connected to the ground line 23 through which the ground voltage VSS is supplied, while the other end of the resistor 26 is connected to the substrate of the NMIS transistor 24. In this embodiment, a capacitor is used as the capacitor 25. However, according to the present invention, as for the capacitor 25, wiring capacitance, gate capacitance, junction capacitance and the like may be alternatively used. Furthermore, as for the resistor 26, wiring resistance, gate resistance, transistor resistance or the like may be alternatively used.

Next, an operation of the above-described semiconductor integrated circuit device during an ESD test will be described with reference to FIGS. 14A and 14B again.

First, the semiconductor integrated circuit device of this embodiment (which is used as the device to be tested 154 in FIG. 14A) is placed in the evaluation circuit. At this time, the power supply line 22 of the semiconductor integrated circuit device shown in FIG. 8 is placed in an open state, and the voltage of the ground line 23 is fixed at the voltage VSS. Then, the selector switch 152 is operated so that the charge power supply 150 allows electrical charges to be accumulated in the charge and discharge capacitor 151. Thereafter, one electrode of the charge and discharge capacitor 151 is connected to the discharge resistor 153 via the selector switch 152. Thus, a positive electrical charge is applied to the external connection terminal 1 shown in FIG. 8.

In this case, in the path leading from the external connection terminal 1 to the power supply line 22, the PN diode 36 functions as a forward diode. On the other hand, in the path leading from the external connection terminal 1 to the ground line 23, the PN diode 37 functions as a backward diode.

A positive electrical charge applied to the external connection terminal 1 flows into the power supply line 22 through the PN diode 36, and the potential of the power supply line 22 is increased. In this embodiment, the capacitor 25 is connected between the power supply line 22 and the substrate of the NMIS transistor 24. Furthermore, the resistor 26 is provided between the ground line 23 and the substrate of the NMIS transistor 24.

Thus, when the potential of the power supply line 22 is increased, the gate potential of the NMIS transistor 24 is also increased. Therefore, the NMIS transistor 24 is likely to be turned ON. If the NMIS transistor 24 is turned ON, the positive electrical charge supplied to the external connection terminal 1 is discharged toward the ground line 23. In this case, the NMIS transistor 24 contributes to this discharge also as a parasitic bipolar transistor.

In the known device, a positive surge applied to an external connection terminal flows through a parasitic backward diode of an NMIS transistor in an electrostatic discharge protection circuit, and the positive surge is then discharged to a ground line 23. However, since transistor size has been reduced in recent years, the NMIS transistor might be destroyed. In contrast, in the present invention, a surge can be discharged to the ground line 23 through the NMIS transistor 24 in the inter-power supply electrostatic discharge protection circuit 6. As a result, a larger amount of surge current can be discharged, and degradation in surge resistance can be prevented.

Note that this embodiment has been described on the supposition that the input circuit is provided with the substrate potential control circuit 7 formed in the same way as that in the first embodiment. However, in the present invention, the substrate potential control circuit 7 may be formed in the same way as any of the substrate potential control circuits in the second through sixth embodiments. Even if any of these substrate potential control circuits is used, it is possible to achieve the effect of preventing degradation in surge resistance.

Ninth Embodiment

Figure 9:
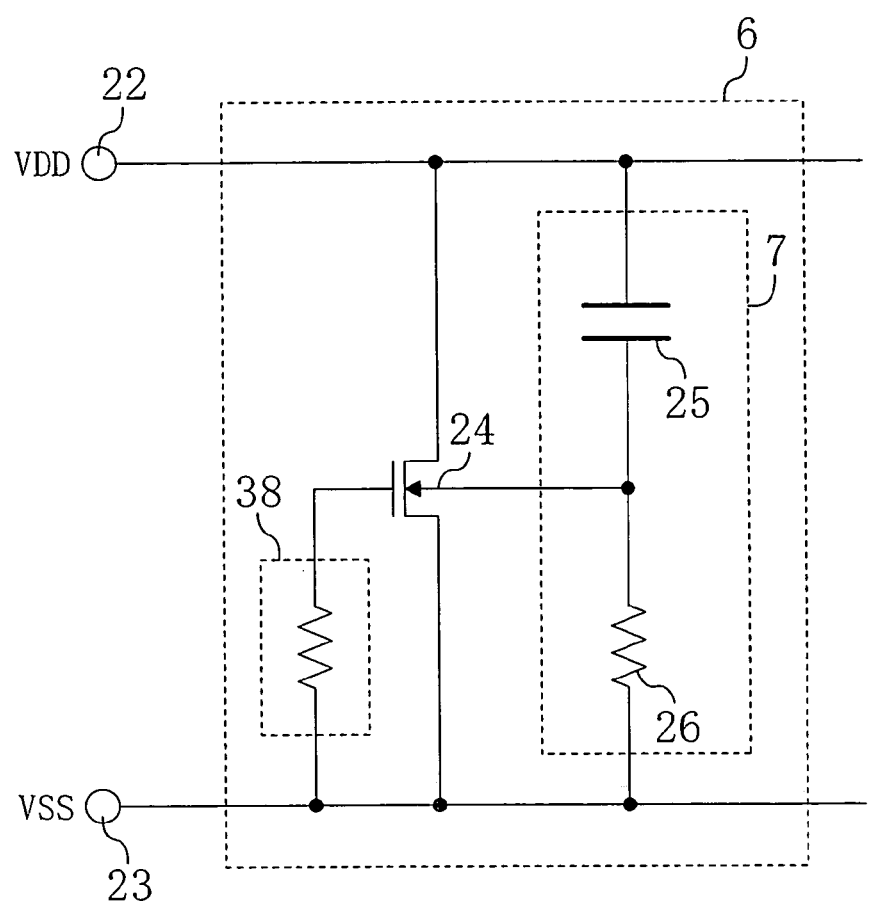
FIG. 9 is a circuit diagram illustrating the configuration of an electrostatic discharge protection circuit according to a ninth embodiment of the present invention.

Hereinafter, a ninth embodiment of the present invention will be described with reference to the drawings. The semiconductor integrated circuit device of the ninth embodiment is similar in configuration to that of the first embodiment except for an inter-power supply electrostatic discharge protection circuit, and therefore, description of part of the semiconductor integrated circuit device other than the inter-power supply electrostatic discharge protection circuit will be omitted. FIG. 9 is a circuit diagram illustrating the configuration of an electrostatic discharge protection circuit according to the ninth embodiment of the present invention.

As shown in FIG. 9, the inter-power supply electrostatic discharge protection circuit 6 of the ninth embodiment is provided between a power supply line 22 and a ground line 23 and includes: an NMIS transistor 24; and substrate potential control circuit 7; and a resistance 38. This embodiment is characterized in that the resistance 38 is provided between the gate of the NMIS transistor 24 and the ground line 23. As the resistance 38, wiring resistance, gate resistance, transistor resistance or the like may be alternatively used. The resistance 38 and a parasitic capacitance extending from the NMIS transistor 24 to the ground line 23 together constitute an RC circuit. Note that as the parasitic capacitance, wiring capacitance, gate capacitance, fringe capacitance, i.e., capacitance between the gate and the drain/source or the like may be used.

The NMIS transistor 24 includes: a source connected to the ground line 23 for grounding; a drain connected to the power supply line 22 through which a power supply voltage VDD is supplied; and a gate connected to the ground line 23 through which the ground voltage VSS is supplied; and a gate connected to the ground line 23 through which the ground voltage VSS is supplied; and a substrate connected to an output terminal of the substrate potential control circuit 7.

The substrate potential control circuit 7 is provided between the power supply line 22 and the ground line 23 and includes a capacitor 25 and a resistor 26. One end of the capacitor 25 is connected to the power supply line 22 through which the power supply voltage VDD is supplied, while the other end of the capacitor 25 is connected to the substrate of the NMIS transistor 24. On the other hand, one end of the resistor 26 is connected to the ground line 23 through which a ground voltage VSS is supplied, while the other end of the resistor 26 is connected to the substrate of the NMIS transistor 24. In this embodiment, a capacitor is used as the capacitor 25. However, according to the present invention, as for the capacitor 25, wiring capacitance, gate capacitance, junction capacitance and the like may be alternatively used. Furthermore, as for the resistor 26, wiring resistance, gate resistance, transistor resistance or the like may be alternatively used.

Next, an operation of the above-described semiconductor integrated circuit device during an ESD test will be described with reference to FIGS. 14A and 14B again. Since the semiconductor integrated circuit device of the ninth embodiment is similar in configuration to the semiconductor integrated circuit device shown in FIG. 1 except for the inter-power supply electrostatic discharge protection circuit 6, the description will be made also with reference to FIG. 1.

In this embodiment, as in the first embodiment, a positive electrical charge supplied to the external connection terminal 1 can be easily discharged by an RC circuit made up of the capacitor 25 and the resistor 26. Therefore, degradation in surge resistance can be prevented.

Furthermore, in this embodiment, a resistor 38 is provided between the NMIS transistor 24 and the ground line 23. The resistor 38 and a parasitic capacitance extending from the NMIS transistor 24 to the ground line 23 together constitute an RC circuit. A positive electrical charge is supplied to the external connection terminal 1 by the RC circuit. Therefore, when the substrate potential of the NMIS transistor 24 is increased, the gate potential of the NMIS transistor 24 is increased. Accordingly, the potential difference between the substrate potential and gate potential of the NMIS transistor 24 is reduced. As the potential difference is reduced, the value for a voltage applied to a gate insulating film of the NMIS transistor 24 is reduced. Therefore, the NMIS transistor 24 is hardly destroyed. Note that this embodiment is particularly effective as an inter-power protection device for a thin film transistor whose gate insulating film has a relatively low resistance.

Note that this embodiment has been described on the supposition that a circuit having the same configuration of the first embodiment is provided as the substrate potential control circuit 7. However, according to the present invention, the substrate potential control circuit 7 may be formed in the same way as either one of the substrate potential control circuits of the second and third embodiments. Even if any of these substrate circuits is used, it is possible to achieve the effect of preventing degradation in surge resistance.

Note that in this embodiment, the inter-power supply electrostatic discharge protection circuit 6 is applied to an input/output circuit having the configuration of the first embodiment. However, according to the present invention, the inter-power supply electrostatic discharge protection circuit 6 can be applied to an input circuit having the configuration of the seventh or eighth embodiment.

Tenth Embodiment

Figure 10:
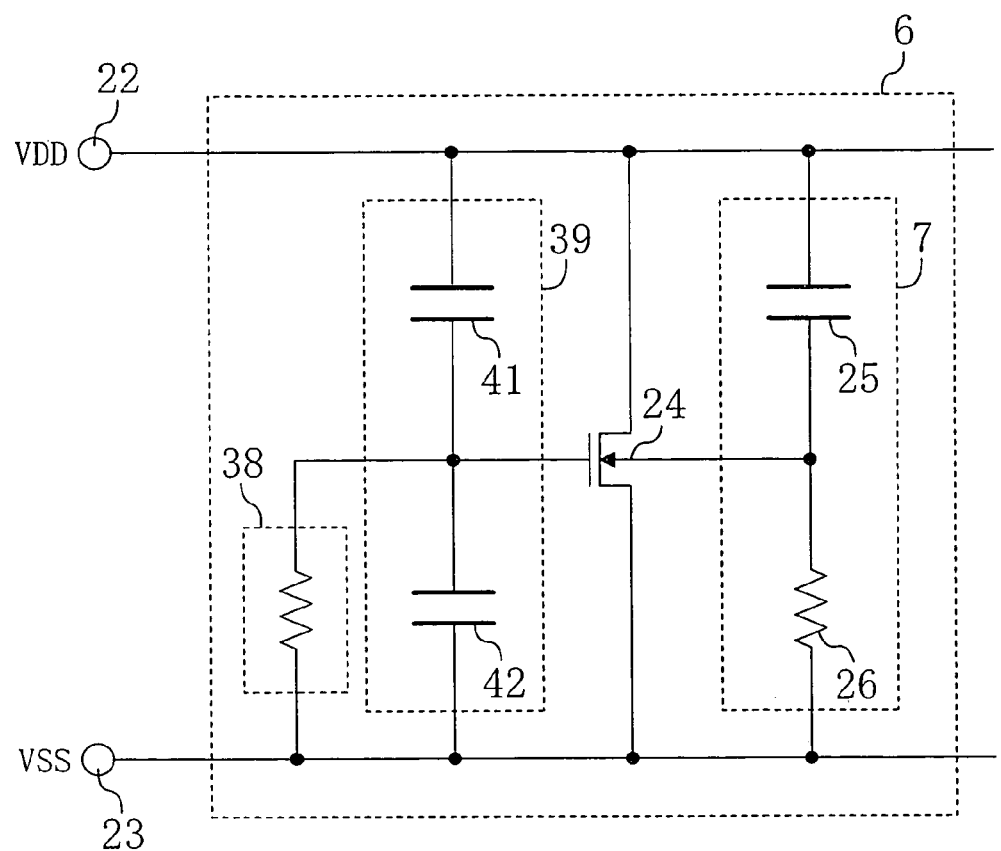
FIG. 10 is a circuit diagram illustrating the configuration of an electrostatic discharge protection circuit according to a tenth embodiment of the present invention.

Hereinafter, a tenth embodiment of the present invention will be described with reference to the drawings. The semiconductor integrated circuit device of the tenth embodiment is similar in configuration to that of the first embodiment except for an inter-power supply electrostatic discharge protection circuit, and therefore, description of part of the semiconductor integrated circuit device other than the inter-power supply electrostatic discharge protection circuit will be omitted. FIG. 10 is a circuit diagram illustrating the configuration of an electrostatic discharge protection circuit according to the tenth embodiment of the present invention.

As shown in FIG. 10, the inter-power supply electrostatic discharge protection circuit 6 of the tenth embodiment is provided between a power supply line 22 and a ground line 23 and includes: an NMIS transistor 24; a substrate potential control circuit 7; a resistor 38; and a capacitor 39.

This embodiment is characterized in that the resistor 38 and the capacitor 39 are provided. The resistor 38 and the capacitor 39 together constitute an RC circuit.

One end of the resistor 38 is connected to the gate of the NMIS transistor 24, while the other end of the resistor 38 is connected to the ground line 23. As for the resistor 38, wiring resistance, gate resistance, transistor resistance or the like may be alternatively used.

The capacitor 39 includes a first capacitor 41 and a second capacitor 42. One end of the first capacitor 41 is connected to the gate of the NMIS transistor 24 and the resistor 38, while the other end of the first capacitor 41 is connected to the power supply line 22. On the other hand, one end of the second capacitor 42 is connected to the gate of the NMIS transistor 24 and the resistor 38, while the other end is connected to the ground line 23. In the ninth embodiment, the parasitic capacitance is used as the capacitor of the RC circuit. However, in this embodiment, the capacitor 39 is separately provided. Thus, a desired capacitance value can be achieved by adjusting a value for the total capacitance of the capacitor 41 and the capacitor 42. As a matter of course, only one of the first and second capacitors 41 and 42 may also be provided. As for the capacitor 39, wiring capacitance, gate capacitance, fringe capacitance, i.e., capacitance between a gate and a source/drain may be alternatively used.

The NMIS transistor 24 includes: a source connected to the ground line 23 for grounding; a drain connected to the power supply line 22 through which the power supply voltage VDD is supplied; a gate connected to the ground line 23 through which a ground voltage VSS is supplied; and a substrate connected to an output terminal of the substrate potential control circuit 7.

The substrate potential control circuit 7 is provided between the power supply line 22 and the ground line 23 and includes a capacitor 25 and a resistor 26. One end of the capacitor 25 is connected to the power supply line 22 through which the power supply voltage VDD is supplied, while the other end of the capacitor 25 is connected to the substrate of the NMIS transistor 24. On the other hand, one end of the resistor 26 is connected to the ground line 23 through which a ground voltage VSS is supplied, while the other end of the resistor 26 is connected to the substrate of the NMIS transistor 24. In this embodiment a capacitor is used as the capacitor 25. However, according to the present invention, as for the capacitor 25, wiring capacitance, gate capacitance, junction capacitance and the like may be alternatively used. Furthermore, as for the resistor, wiring resistance, gate resistance, transistor resistance or the like may be alternatively used.

Next, an operation of the above-described semiconductor integrated circuit device during an ESD test will be described with reference to FIGS. 14A and 14B again. Since the semiconductor integrated circuit device of the tenth embodiment is similar in configuration to the semiconductor integrated circuit device shown in FIG. 1 except for the inter-power supply electrostatic discharge protection circuit 6, the description will be made also with reference to FIG. 1.

In this embodiment, as in the first embodiment, a positive electrical charge supplied to the external connection terminal 1 can be easily discharged by an RC circuit made up of the capacitor 25 and the resistor 26. Therefore, degradation in surge resistance can be prevented.

Furthermore, in this embodiment, the resistor 38 and the capacitor 39 together constitute an RC circuit. With the RC circuit provided, a positive electrical charge is supplied to the external connection terminal 1, and when the substrate potential of the NMIS transistor 24 is increased, and the gate potential of the NMIS transistor 24 is increased. Accordingly, the potential difference between the substrate potential and gate potential of the NMIS transistor 24 is reduced. As the potential difference is reduced, a value for a voltage applied to a gate insulating film of the NMIS transistor 24 is reduced. Therefore, the NMIS transistor 24 is hardly destroyed. Note that this embodiment is particularly effective as an inter-power protection device for a thin film transistor whose gate insulating film has a relatively low resistance.

Note that this embodiment has been described on the supposition that a circuit having the same configuration of the first embodiment is provided as the substrate potential control circuit 7. However, according to the present invention, the substrate potential control circuit 7 may be formed in the same way as either one of the substrate potential control circuits of the second and third embodiments. Even if any of these substrate circuits is used, it is possible to achieve the effect of preventing degradation in surge resistance.

Note that in this embodiment, the inter-power supply electrostatic discharge protection circuit 6 is applied to an input/output circuit having the configuration of the first embodiment. However, according to the present invention, the inter-power supply electrostatic discharge protection circuit 6 can be applied to an input circuit having the configuration of the seventh or eighth embodiment.

Eleventh Embodiment

Figure 11:
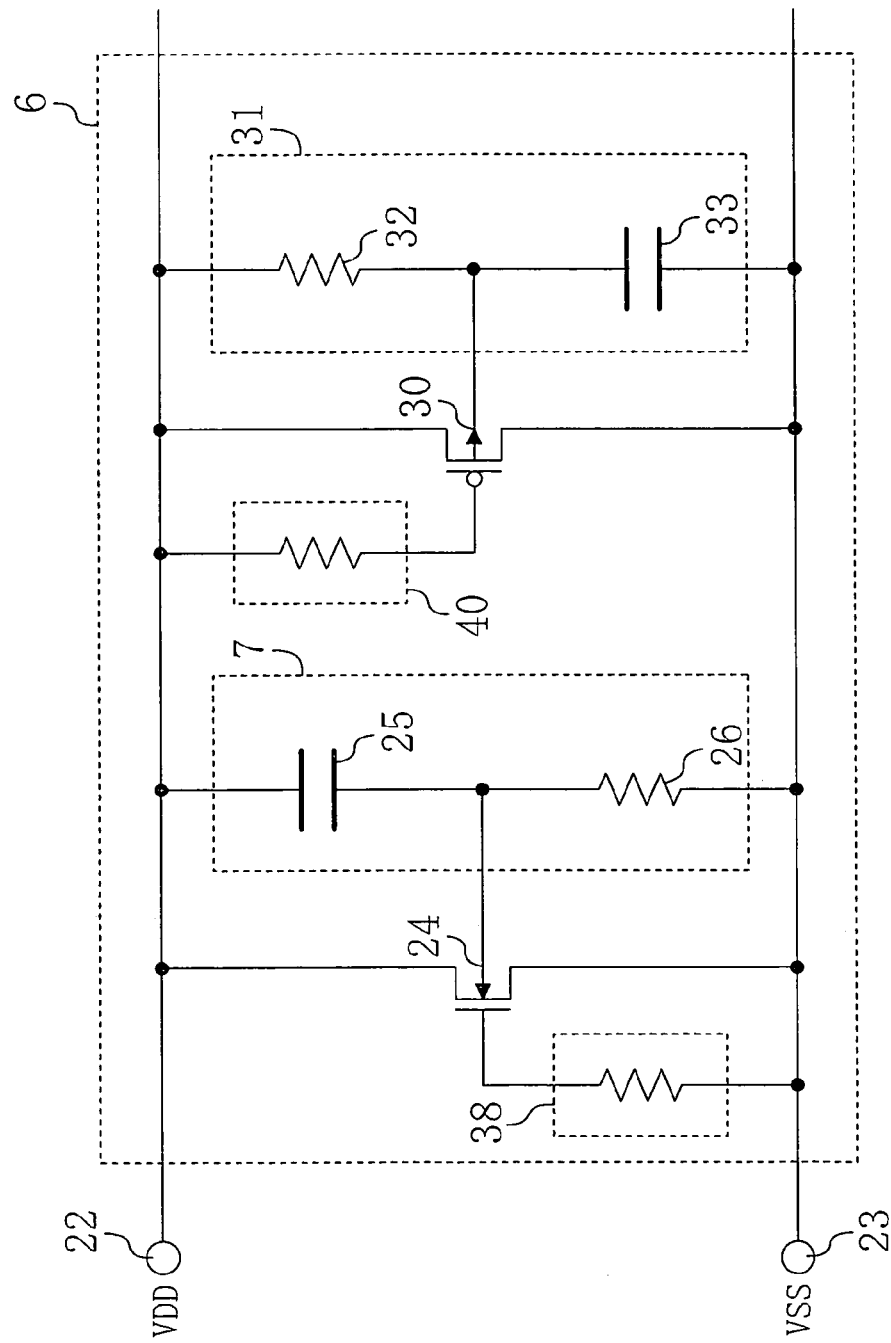
FIG. 11 is a circuit diagram illustrating the configuration of an electrostatic discharge protection circuit according to an eleventh embodiment of the present invention.

Hereinafter, an eleventh embodiment of the present invention will be described with reference to the drawings. The semiconductor integrated circuit device of the eleventh embodiment is similar in configuration to that of the first embodiment except for an inter-power supply electrostatic discharge protection circuit, and therefore, description of part of the semiconductor integrated circuit device other than the inter-power supply electrostatic discharge protection circuit will be omitted. FIG. 11 is a circuit diagram illustrating the configuration of an electrostatic discharge protection circuit according to the eleventh embodiment of the present invention.

As shown in FIG. 11, the inter-power supply electrostatic discharge protection circuit 6 of this embodiment is provided between a power supply line 22 and a ground line 23 and includes: an NMIS transistor 24; a substrate potential control circuit 7; and a resistor 38. In addition, the inter-power supply electrostatic discharge protection circuit 6 of this embodiment includes: a PMIS transistor 30, a substrate potential control circuit 31; and a resistor 40.

The NMIS transistor 24, the substrate potential control circuit 7 and the resistor 38 are similar in configuration to those of the ninth embodiment, and, therefore, description thereof will be omitted.

One end of the resistor 40 is connected to the gate of the PMIS transistor 30, while the other end of the resistor 40 is connected to the power supply line 22. As for the resistor 40, wiring resistance, gate resistance, transistor resistance or the like may be alternatively used. The resistor 40 and a parasitic capacitance extending from the PMIS transistor 30 to the power supply line 22 together constitute an RC circuit. Note that as for the parasitic capacitance, wiring capacitance, gate capacitance, fringe capacitance, i.e., capacitance between a gate and a source/drain may be alternatively used.

The substrate potential control circuit 31 is provided between the power supply line 22 and the ground line 23 and includes a capacitor 33 and a resistor 32. One end of the resistor 32 is connected to the power supply line 22 through which the power supply voltage VDD is supplied, while the other end of the resistor 32 is connected to the substrate of the PMIS transistor 30. On the other hand, one end of the capacitor 33 is connected to the ground line 23 through which the ground voltage VSS is supplied, while the other end of the capacitor 33 is connected to the substrate of the PMIS transistor 30. As for the capacitor 25, not only a capacitor but also wiring capacitance, gate capacitance, junction capacitance or the like other than the capacitor may be used. Furthermore, as for the resistor 26, wiring resistance, gate resistance, transistor resistance or the like may be alternatively used.

As for carrying out the ESD test, there is the case where the power supply line 22 is placed in an open state and the voltage of the ground line 23 is fixed at the voltage VSS as described in the fourth through sixth embodiments, and there is also the case where the voltage of the power supply line 22 is fixed at the voltage VDD and the ground line 23 is placed in an open state. The semiconductor integrated circuit device of this embodiment is adaptable to both the cases.

First, the power supply line 22 of the semiconductor integrated circuit device shown in FIG. 1 is placed in an open state, and the voltage of the ground line 23 is fixed at the voltage VSS. Then, a positive electrical charge is applied to the external connection terminal 1. In this case, the device is operated in the same way as in the ninth embodiment, thereby enabling the discharge of surge.

Next, the ground line 23 of the semiconductor integrated circuit device shown in FIG. 1 is place in an open state, and the voltage of the power supply line 22 is fixed at the voltage VDD. Then, a negative electrical charge is applied to the external connection terminal 1.

In this case, a positive electrical charge supplied to the external connection terminal 1 can be easily discharged by an RC circuit made up of the capacitor 33 and the resistor 32. Therefore, degradation in surge resistance can be prevented.

Furthermore, in this embodiment, the resistor 40 is provided between the gate of the PMIS transistor 30 and the power supply line 22. The resistor 40 and a parasitic capacitance extending from the PMIS transistor 30 to the power supply line 22 together constitute the RC circuit. With the RC circuit provided, a negative electrical charge is supplied to the external connection terminal 1, and as the substrate potential of the PMIS transistor 30 is reduced, the gate potential of the PMIS transistor 30 is reduced. Accordingly, a potential difference between the substrate potential and gate potential of the PMIS transistor 30 is reduced. When the potential difference is reduced, a value for a voltage to be applied to a gate insulating film of the PMIS transistor 30 is reduced. Therefore, the PMIS transistor 30 is hardly destroyed. Note that this embodiment is particularly effective as an inter-power protection device for a thin film transistor whose gate insulating film has a relatively low resistance.

Note that this embodiment has been described on the supposition that a circuit having the same configuration of the first embodiment is provided as each of the substrate potential control circuits 7 and 31. However, according to the present invention, the substrate potential control circuits 7 and 31 may be formed in the same way as either one of the substrate potential control circuits of the second and third embodiments. Even if any of these substrate circuits is used, it is possible to achieve the effect of preventing degradation in surge resistance.

Note that in this embodiment, the inter-power supply electrostatic discharge protection circuit 6 is applied to an input/output circuit having the configuration of the first embodiment. However, according to the present invention, the inter-power supply electrostatic discharge protection circuit 6 can be applied to an input circuit having the configuration of the seventh or eighth embodiment.

Twelfth Embodiment

Figure 12:
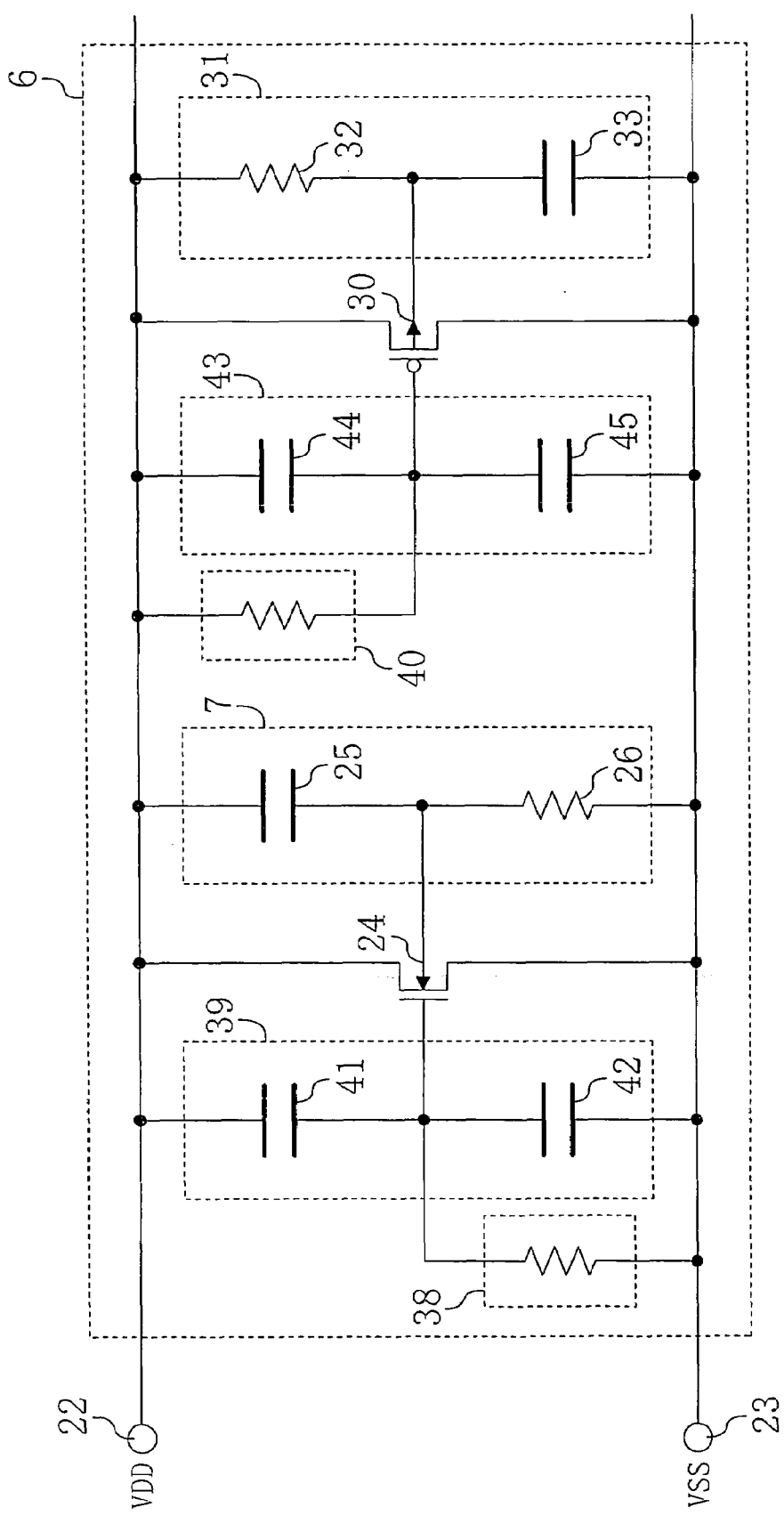
FIG. 12 is a circuit diagram illustrating the configuration of an electrostatic discharge protection circuit according to a twelfth embodiment of the present invention.

Hereinafter, a twelfth embodiment of the present invention will be described with reference to the drawings. The semiconductor integrated circuit device of the twelfth embodiment is similar in configuration to that of the first embodiment except for an inter-power supply electrostatic discharge protection circuit, and therefore, description of part of the semiconductor integrated circuit device other than the inter-power supply electrostatic discharge protection circuit will be omitted. FIG. 12 is a circuit diagram illustrating the configuration of an electrostatic discharge protection circuit according to the twelfth embodiment of the present invention.

As shown in FIG. 12, the inter-power supply electrostatic discharge protection circuit 6 of this embodiment is provided between a power supply line 22 and a ground line 23 and includes: an NMIS transistor 24; a substrate potential control circuit 7; a resistor 38; and a capacitor 39. In addition, the inter-power supply electrostatic discharge protection circuit 6 of this embodiment includes: a PMIS transistor 30, a substrate potential control circuit 31; a resistor 40; and a capacitor 43.

The NMIS transistor 24, the substrate potential control circuit 7, the resistor 38 and the capacitor 39 are similar in configuration to those descried of the tenth embodiment.

One end of the resistor 40 is connected to the capacitor 43 and the gate of the PMIS transistor 30, while the other end of the resistor 40 is connected to the power supply line 22. As for the resistor 40, wiring resistance, gate resistance, transistor resistance or the like may be alternatively used.

The capacitor 43 includes a first capacitor 44 and a second capacitor 45. One end of the first capacitor 44 is connected to the gate of the PMIS transistor 30 and the resistor 40, while the other end of the first capacitor 44 is connected to the power supply line 22. On the other hand, one end of the second capacitor 45 is connected to the gate of the PMIS transistor 30 and the resistor 40, while the other end of the second capacitor 45 is connected to the ground line 23. In the eleventh embodiment, a parasitic capacitance is used as the capacitor of the RC circuit. However, in this embodiment, the capacitor 43 is separately provided. Thus, a desired capacitance value can be achieved by adjusting a value for the total capacitance of the capacitor 44 and the capacitor 45. As a matter of course, only one of the first and second capacitors 44 and 45 may also be provided. As for the capacitor 43, wiring capacitance, gate capacitance, fringe capacitance, i.e., capacitance between a gate and a source/drain may be alternatively used.

The substrate potential control circuit 31 is provided between the power supply line 22 and the ground line 23 and includes a capacitor 33 and a resistor 32. One end of the resistor 32 is connected to the power supply line 22 through which the power supply voltage VDD is supplied, while the other end of the resistor 32 is connected to the substrate of the PMIS transistor 30. On the other hand, one end of the capacitor 33 is connected to the ground line 23 through which the ground voltage VSS is supplied, while the other end of the capacitor 33 is connected to the substrate of the PMIS transistor 30. As for the capacitor 25, not only a capacitor but also wiring capacitance, gate capacitance, junction capacitance or the like may be used. Furthermore, as for the resistor 26, wiring resistance, gate resistance, transistor resistance or the like may be alternatively used.

As for carrying out the ESD test, there is the case where the power supply line 22 is placed in an open state and the voltage of the ground line 23 is fixed at the voltage VSS as described in the fourth through sixth embodiments, and there is also the case where the voltage of the power supply line 22 is fixed at the voltage VDD and the ground line 23 is placed in an open state. The semiconductor integrated circuit device of this embodiment is adaptable to both the cases.

First, the power supply line 22 of the semiconductor integrated circuit device shown in FIG. 1 is placed in an open state, and the voltage of the ground line 23 is fixed at the voltage VSS. Then, a positive electrical charge is applied to the external connection terminal 1. In this case, the device is operated in the same way as in the tenth embodiment, thereby enabling the discharge of surge.

Subsequently, a negative electrical charge is applied to the external connection terminal 1, with the ground line 23 of the semiconductor integrated circuit device shown in FIG. 1 being placed in an open state and the voltage of the power supply line 22 being fixed at the voltage VDD.

In this case, a positive electrical charge supplied to the external connection terminal 1 can be easily discharged by an RC circuit made up of the capacitor 33 and the resistor 32. Therefore, degradation in surge resistance can be prevented.

Furthermore, in this embodiment, the resistor 40 and the capacitor 43 together constitute an RC circuit. With the RC circuit provided, a negative electrical charge is supplied to the external connection terminal 1, and when the substrate potential of the PMIS transistor 30 is reduced, the gate potential of the PMIS transistor 30 is reduced. Accordingly, a potential difference between the substrate potential and gate potential of the PMIS transistor 30 is reduced. When the potential difference is reduced, a value for a voltage applied to a gate insulating film of the PMIS transistor 30 is simultaneously reduced. Therefore, the PMIS transistor 30 is hardly destroyed. Note that this embodiment is particularly effective as an inter-power protection device for a thin film transistor whose gate insulating film has a relatively low resistance.

Note that this embodiment has been described on the supposition that a circuit having the same configuration of the first embodiment is provided as the substrate potential control circuits 7 and 31. However, according to the present invention, the substrate potential control circuits 7 and 31 may be formed in the same way as any of the substrate potential control circuits of the second and third embodiments. Even if any of these substrate circuits is used, it is possible to achieve the effect of preventing degradation in surge resistance.

Note that in this embodiment, the inter-power supply electrostatic discharge protection circuit 6 is applied to an input/output circuit having the configuration of the first embodiment. However, according to the present invention, the inter-power supply electrostatic discharge protection circuit 6 can be applied to an input circuit having the configuration of the seventh or eighth embodiment.

Other Embodiments

The positions of the respective circuits between the electrostatic discharge protection circuit 2 and the inter-power supply electrostatic discharge protection circuit 6, which have been described in the foregoing embodiments, are shown by way of example. In the present invention, each circuit may be provided at any position on a chip.

What is claimed is:

1. A semiconductor integrated circuit device comprising:
   an external connection terminal;
   an electrostatic discharge protection circuit connected to the external connection terminal;
   a power supply line connected to the electrostatic discharge protection circuit;
   a ground line connected to the electrostatic discharge protection circuit; and
   an inter-power supply electrostatic discharge protection circuit connected to the power supply line and the ground line and including a gate insulating element,
   wherein the inter-power supply electrostatic discharge protection circuit comprises a first substrate potential control circuit capable of controlling a substrate voltage of the gate insulating element,
   wherein the gate insulating element comprises a first NMIS transistor having a source connected to the ground line and a drain connected to the power supply line, and
   wherein the first substrate potential control circuit comprises:
   a first inverter section connected at its output only to a substrate of the first NMIS transistor and including an uneven number of inverters;
   a resistor having one end connected to the power supply line and another end connected to an input of the first inverter section; and
   a capacitor having one end connected to the ground line and another end connected to the input of the first inverter section.

2. The semiconductor integrated circuit device of claim 1, wherein the inter-power supply electrostatic discharge protection circuit further comprises a first gate potential control circuit connected to a gate of the gate insulating element and being capable of controlling a gate voltage of the gate insulating element.

3. The semiconductor integrated circuit device of claim 2, wherein the first gate potential control circuit comprises a resistor having one end connected to the gate of the gate insulating element and another end connected to the ground line.

4. The semiconductor integrated circuit device of claim 3, wherein the first gate potential control circuit further comprises a capacitor having one end connected to the gate of the gate insulating element and the resistor of the first gate potential control circuit.

5. The semiconductor integrated circuit device of claim 1, wherein the inter-power supply electrostatic discharge protection circuit further comprises
   a first PMIS transistor having source connected to the power supply line and drain connected to the ground line, and
   a second substrate potential control circuit capable of controlling a substrate voltage of the first PMIS transistor.

6. The semiconductor integrated circuit device of claim 5, wherein the second substrate potential control circuit further comprises
   a resistor having one end connected to the power supply line and another end connected to the substrate of the first PMIS transistor, and
   a capacitor having one end connected to the ground line and another end connected to the substrate of the first PMIS transistor.

7. The semiconductor integrated circuit device of claim 5, wherein the second substrate potential control circuit comprises a second inverter section connected at its output to the substrate of the first PMIS transistor and including an uneven number of inverters, a capacitor having one end connected to the power supply line and another end connected to an input of the second inverter section, and a resistor having one end connected to the ground line and another end connected to the input of the second inverter section.

8. The semiconductor integrated circuit device of claim 5, wherein the second substrate potential control circuit comprises a second inverter section connected at its output to the substrate of the first PMIS transistor and including an even number of inverters, a capacitor having one end connected to the ground line and another end connected to an input of the second inverter section, and a resistor having one end connected to the power supply line and another end connected to the input of the second inverter section.

9. The semiconductor integrated circuit device of claim 5, wherein the second substrate potential control circuit comprises a second Schmidt trigger circuit connected at its output to the substrate of the first PMIS transistor, a capacitor having one end connected to the power supply line and another end connected to an input of the second Schmidt trigger circuit, and a resistor having one end connected to the ground line and another end connected to the input of the second Schmidt trigger circuit.

10. The semiconductor integrated circuit device of claim 5, wherein the inter-power supply electrostatic discharge protection circuit further comprises a second gate potential control circuit connected to a gate of the first PMIS transistor and being capable of controlling a gate voltage of the first PMIS transistor.

11. The semiconductor integrated circuit device of claim 10, wherein the second gate potential control circuit comprises a resistor having one end connected to the gate of the first PMIS transistor and another end connected to the power supply line.

12. The semiconductor integrated circuit device of claim 11, wherein the second gate potential control circuit further comprises a capacitor having one end connected to the gate of the first PMIS transistor and the resistor of the second gate potential control circuit.

13. The semiconductor integrated circuit device of claim 1, further comprising an input buffer circuit connected to the external connection terminal.

14. The semiconductor integrated circuit device of claim 1, further comprising:
an output circuit connected to the external connection terminal; and
an output prebuffer circuit connected to the output circuit.

15. The semiconductor integrated circuit device of claim 14, wherein the output prebuffer circuit comprises a first prebuffer circuit having at its last stage a first prebuffer connected to the power supply line, and a second prebuffer circuit having at its last stage a second prebuffer connected to the power supply line, and
wherein the output circuit comprises a second PMIS transistor having a source connected to the power supply line, a drain connected to the external connection terminal, a gate connected to an output terminal of the first prebuffer, and a n-type substrate region connected to the power supply line, and a second NMIS transistor having a source connected to the ground line, a drain connected to the external connection terminal, a gate connected to an output terminal of the second prebuffer, and a p-type substrate region connected to the ground line.

16. The semiconductor integrated circuit device of claim 1, further comprising an internal circuit connected to the external connection terminal.

17. The semiconductor integrated circuit device of claim 1, wherein the electrostatic discharge protection circuit comprises: a third PMIS transistor having a source connected to the power supply line, a drain connected to the external connection terminal, and a n-type substrate region connected to the power supply line; and a third NMIS transistor having a source connected to the ground line, a drain connected to the external connection terminal, and a p-type substrate region connected to the ground line.

18. The semiconductor integrated circuit device of claim 17, further comprising:
a resistor interposed between the gate of the third PMIS transistor and the power supply line; and
a resistor interposed between the gate of the third NMIS transistor and the ground line.

19. The semiconductor integrated circuit device of claim 1, wherein the electrostatic discharge protection circuit comprises a first PN diode having one end connected to the power supply line and another end connected to the external connection terminal, and a second PN diode having one end connected to the ground line and another end connected to the external connection terminal.

20. A semiconductor integrated circuit device comprising:
an external connection terminal;
an electrostatic discharge protection circuit connected to the external connection terminal;
a power supply line connected to the electrostatic discharge protection circuit;
a ground line connected to the electrostatic discharge protection circuit; and
an inter-power supply electrostatic discharge protection circuit connected to the power supply line and the ground line and including a gate insulating element,
wherein the inter-power supply electrostatic discharge protection circuit comprises a first substrate potential control circuit capable of controlling a substrate voltage of the gate insulating element,
wherein the gate insulating element is a first NMIS transistor having a source connected to the ground line and a drain connected to the power supply line, and
wherein the first substrate potential control circuit comprises:
a first inverter section connected at its output only to the substrate of the first NMIS transistor and including an even number of inverters;
a resistor having one end connected to the ground line and another end connected to an input of the first inverter section; and
a capacitor having one end connected to the power supply line and another end connected to the input of the first inverter section.

21. A semiconductor integrated circuit device comprising:
an external connection terminal;
an electrostatic discharge protection circuit connected to the external connection terminal;
a power supply line connected to the electrostatic discharge protection circuit;
a ground line connected to the electrostatic discharge protection circuit; and
an inter-power supply electrostatic discharge protection circuit connected to the power supply line and the ground line and including a gate insulating element,
wherein the inter-power supply electrostatic discharge protection circuit comprises a first substrate potential control circuit capable of controlling a substrate voltage of the gate insulating element, wherein the gate insulating element is a first NMIS transistor having a source connected to the ground line and a drain connected to the power supply line, and wherein the first substrate potential control circuit comprises:

a first Schmidt trigger circuit connected at its output only to the substrate of the first NMIS transistor;

a resistor having one end connected to the power supply line and another end connected to an input of the first Schmidt trigger circuit; and a capacitor having one end connected to the ground line and another end connected to the input of the first Schmidt trigger circuit.

* * * * *